US010443557B2

(12) United States Patent
Yamaguchi et al.

(10) Patent No.: US 10,443,557 B2
(45) Date of Patent: Oct. 15, 2019

(54) IGNITER

(71) Applicant: DENSO CORPORATION, Kariya, Aichi-pref. (JP)

(72) Inventors: Motoo Yamaguchi, Kariya (JP); Fujiyuki Iwamoto, Kariya (JP); Shunichi Takeda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/773,284

(22) PCT Filed: Oct. 7, 2016

(86) PCT No.: PCT/JP2016/079967
§ 371 (c)(1),
(2) Date: May 3, 2018

(87) PCT Pub. No.: WO2017/077814
PCT Pub. Date: May 11, 2017

(65) Prior Publication Data
US 2018/0320652 A1 Nov. 8, 2018

(30) Foreign Application Priority Data

Nov. 4, 2015 (JP) .................................. 2015-216898
Aug. 26, 2016 (JP) .................................. 2016-165699

(51) Int. Cl.
*F02P 3/00* (2006.01)
*F02P 3/055* (2006.01)
(Continued)

(52) U.S. Cl.
CPC ................. *F02P 3/055* (2013.01); *F02P 3/04* (2013.01); *F02P 3/053* (2013.01); *F02P 15/00* (2013.01); *H01L 23/48* (2013.01); *H01L 23/49548* (2013.01); *H01L 23/49562* (2013.01); *H01L 23/49575* (2013.01); *H01L 23/49589* (2013.01); *H01L 23/62* (2013.01); *H01L 24/42* (2013.01);
(Continued)

(58) Field of Classification Search
CPC .... F02P 3/055; F02P 3/04; F02P 3/053; F02P 15/00; H01L 23/62
See application file for complete search history.

(56) References Cited

U.S. PATENT DOCUMENTS 5,563,332 A 10/1996 Yasuda
2001/0007252 A1* 7/2001 Ito ........................... F02P 3/053
123/630

(Continued)

FOREIGN PATENT DOCUMENTS

JP 4-27170 3/1992
JP 9-228937 9/1997
(Continued)

Primary Examiner — Thomas N Moulis
(74) Attorney, Agent, or Firm — Nixon & Vanderhye P.C.

(57) ABSTRACT

An igniter includes a switching element, a control circuit section, and a protection element. The switching element is connected to a primary winding of an ignition coil. The control circuit section is configured to control operation of the switching element. The protection element is configured to electrically protect the control circuit section. The switching element and the protection element are formed in the same semiconductor chip, and are mounted on the same lead frame.

12 Claims, 24 Drawing Sheets

(51) Int. Cl.
*F02P 3/05* (2006.01)
*H01L 23/00* (2006.01)
*H01L 23/62* (2006.01)
*F02P 3/04* (2006.01)
*F02P 15/00* (2006.01)
*H01L 23/48* (2006.01)
*H01L 25/18* (2006.01)
*H01L 27/04* (2006.01)
*H01L 27/06* (2006.01)
*H01L 25/07* (2006.01)
*H01L 23/495* (2006.01)
*H01L 29/866* (2006.01)
*H01L 21/822* (2006.01)
*H01L 23/50* (2006.01)

(52) U.S. Cl.
CPC ............ *H01L 25/072* (2013.01); *H01L 25/18* (2013.01); *H01L 27/04* (2013.01); *H01L 27/0629* (2013.01); *H01L 21/822* (2013.01); *H01L 23/50* (2013.01); *H01L 29/866* (2013.01); *H01L 2224/48137* (2013.01); *H01L 2224/48195* (2013.01); *H01L 2224/48247* (2013.01); *H01L 2224/49111* (2013.01); *H01L 2924/13055* (2013.01); *H01L 2924/19105* (2013.01)

(56) References Cited

U.S. PATENT DOCUMENTS

2002/0134363 A1\* 9/2002 Meinders .............. F02P 3/0435
                                                                    123/620
2012/0068321 A1   3/2012  Watanabe et al.
2018/0223790 A1\* 8/2018  Takeda .................... F02P 3/00

FOREIGN PATENT DOCUMENTS

| | | |
|---|---|---|
| JP | 2011-074905 | 4/2011 |
| JP | 5278186 | 9/2013 |
| JP | 2014-064344 | 4/2014 |

\* cited by examiner

IGNITER

CROSS-REFERENCE TO RELATED APPLICATION

This application is the U.S. national phase of International Application No. PCT/JP2016/079967 filed Oct. 7, 2016, which designated the U.S. and claims priority to Japanese Patent Application No. 2015-216898 filed Nov. 4, 2015 and Japanese Patent Application No. 2016-165699 filed Aug. 26, 2016, the entire contents of each of which are incorporated herein by reference.

TECHNICAL FIELD

The present disclosure relates to an igniter including a switching element connected to a primary winding of an ignition coil, a control circuit section configured to control operation of the switching element, and a protection element configured to electrically protect the control circuit section.

BACKGROUND ART

An igniter including a switching element such as an IGBT and a control circuit section configured to control operation of the switching element has been known as an igniter for igniting an ignition plug of an internal-combustion engine (refer to Patent Literature 1 below). The switching element is connected to a primary winding of an ignition coil. Moreover, a secondary winding of the ignition coil is connected to the ignition plug. The igniter is configured such that the control circuit section performs on/off operation of the switching element to generate high voltage at the secondary winding and ignite the ignition plug.

A protection element such as a protective resistor or a protection Zener diode is connected to the control circuit section. The protective resistor is provided on a current path between a DC power source and the control circuit section. The protective resistor is configured to absorb any high-energy high-voltage surge caused upon occurrence of so-called load dump, thereby protecting the control circuit section from such a surge. Moreover, the protection Zener diode is connected in parallel with the control circuit section, and is configured to keep a voltage applied from the DC power source to the control circuit section at a constant value. With this configuration, application of high voltage to the control circuit section is avoided, and the control circuit section is protected. These protection elements such as the protective resistor and the protection Zener diode are elements with a relatively high thermal rating, and therefore, are formed separately from the switching element and the control circuit section.

CITATION LIST

Patent Literature

[PTL 1] JP 2011-074905 A

SUMMARY OF THE INVENTION

Technical Problem

As a result of in-depth study of the inventors, a problem has been found that it is difficult to downsize the protection element in the above-described igniter. That is, when absorbing the high-energy high-voltage surge, the protective resistor generates a large amount of heat. Moreover, when Zener current flows, the protection Zener diode also generates a large amount of heat. As described above, the protection element generates a relatively large amount of heat. For this reason, for avoiding damage to the protection element due to heat generation from the protection element itself, the area of the protection element needs to be large, and the amount of heat generation per unit area needs to be small. Thus, in the typical igniter, it is difficult to downsize the protection element and to downsize the entirety of the igniter.

Moreover, the above-described igniter is configured such that the protection element is formed separately from the switching element and the control circuit section, and therefore, the inventors have also found a problem that the number of components is great and a manufacturing cost tends to increase.

The present disclosure is intended to provide an igniter configured so that a protection element can be downsized and a manufacturing cost can be reduced.

Solution to Problem

A first aspect of the present disclosure is an igniter includes a switching element connected to a primary winding of an ignition coil, a control circuit section configured to control operation of the switching element, and a protection element electrically connected to the control circuit section to electrically protect the control circuit section.

The switching element and the protection element are formed in the same semiconductor chip, the igniter further includes, as the protection element, a protective resistor as a resistor arranged on a current path from a DC power source to the control circuit section, a resistor protection Zener diode having a breakdown voltage lower than a dielectric strength voltage of the protective resistor is connected in parallel with the protective resistor, and the resistor protection Zener diode is formed together with the switching element and the protective resistor in the semiconductor chip.

A second aspect of the present disclosure is an igniter includes a switching element connected to a primary winding of an ignition coil, a control circuit section configured to control operation of the switching element, and a protection element electrically connected to the control circuit section to electrically protect the control circuit section.

The switching element and the protection element are formed in the same semiconductor chip, the igniter further includes, as the protection element, a protective resistor as a resistor arranged on a current path from a DC power source to the control circuit section, the switching element is an IGBT, the semiconductor chip includes a field oxide film for element separation, a gate electrode of the IGBT and the protective resistor are made of polysilicon, the protective resistor is formed on the field oxide film the resistor protection Zener diode having the breakdown voltage lower than the dielectric strength voltage of the protective resistor is connected in parallel with the protective resistor, and the resistor protection Zener diode is made of polysilicon, and is formed at a position adjacent to the protective resistor on the field oxide film.

A third aspect of the present disclosure is an igniter includes a switching element connected to a primary winding of an ignition coil, a control circuit section configured to control operation of the switching element, and a protection element electrically connected to the control circuit section to electrically protect the control circuit section.

The switching element and the protection element are formed in the same semiconductor chip, the igniter further includes, as the protection element, a protective resistor as a resistor arranged on a current path from a DC power source to the control circuit section, the igniter further includes a semiconductor chip lead frame on which the semiconductor chip is mounted, and a control circuit lead frame on which the control circuit section is mounted, wherein the semiconductor chip lead frame is formed thicker than the control circuit lead frame.

A fourth aspect of the present disclosure is an igniter includes a switching element connected to a primary winding of an ignition coil, a control circuit section configured to control operation of the switching element, and a protection element electrically connected to the control circuit section to electrically protect the control circuit section.

The switching element and the protection element are formed in the same semiconductor chip, the igniter further includes a protection Zener diode configured to keep voltage applied to the control circuit section at a constant value as the protection element, the igniter further includes a voltage detection resistor configured to detect voltage applied from the DC power source to the semiconductor chip, and an overvoltage protection circuit configured to forcibly turn off the switching element in a case where the applied voltage reaches higher than a preset value.

Advantageous Effects of the Invention

In the above-described igniter, the switching element and the protection element are formed in the same semiconductor chip.

Thus, the protection element can be downsized. That is, the amount of heat generation from the semiconductor chip provided with the switching element is large, and for this reason, the semiconductor chip has a structure with a high radiation efficiency and is arranged in an environment with a high radiation efficiency. For example, the semiconductor chip provided with the switching element is mounted on a thick lead frame with a high radiation efficiency. With forming the protection element in the semiconductor chip, the lead frame for radiation of the semiconductor chip can be also utilized for radiation of the protection element, and the radiation efficiency of the protection element can be enhanced. The amount of heat generation from the protection element is large as described above. However, the protection element is mounted on the semiconductor chip so that the radiation efficiency of the protection element can be enhanced, and an increase in the amount of heat generation per unit area of the protection element is acceptable. Thus, the protection element can be downsized. Consequently, the degree of integration of the entirety of the igniter can be enhanced.

Moreover, the switching element and the protection element are formed in the same semiconductor chip in the above-described igniter, and therefore, the number of components can be reduced. Thus, the cost for manufacturing an igniter can be reduced.

As described above, according to the present disclosure, the igniter can be provided, which is configured so that the protection element can be downsized and the manufacturing cost can be reduced.

Note that each reference numeral in parentheses as described in the claims indicates a correspondence with specific means described in embodiments below, and is not intended to limit the technical scope of the present invention.

BRIEF DESCRIPTION OF THE DRAWINGS

The above-described object, other objects, features, and advantages of the present disclosure will be further clarified from the following detailed description with reference to attached drawings. The drawings are as follows.

DESCRIPTION OF EMBODIMENTS

The above-described igniter can be an in-vehicle igniter for igniting an ignition plug of an engine of an automobile.

(First Embodiment)

Figure 1:
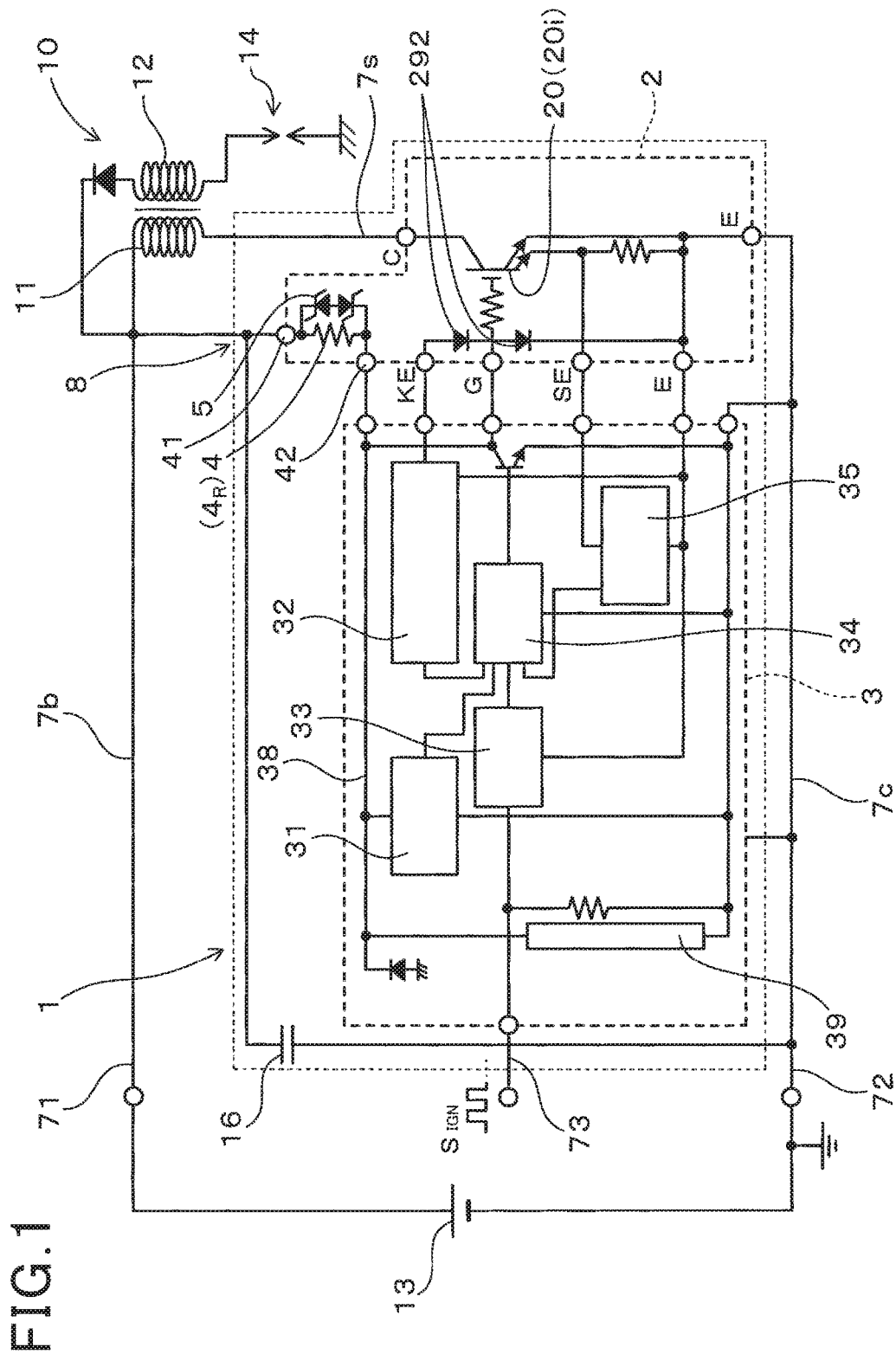
FIG. 1 is a circuit diagram of an ignition device including an igniter in a first embodiment.

An embodiment of the above-described igniter will be described with reference to FIGS. 1 to 7. As illustrated in FIG. 1, an igniter 1 of the present embodiment includes a switching element 20, a control circuit section 3, and a protection element 4. The switching element 20 is connected to a primary winding 11 of an ignition coil 10. The control circuit section 3 is configured to control operation of the switching element 20. The protection element 4 is configured to electrically protect the control circuit section 3. The protection element 4 of the present embodiment is a resistor (hereinafter also referred to as a "protective resistor $4_R$"). The protective resistor $4_R$ is provided on a current path 8 from a DC power source 13 to the control circuit section 3. Power is supplied from the DC power source 13 to the control circuit section 3 via the protective resistor $4_R$.

Figure 5:
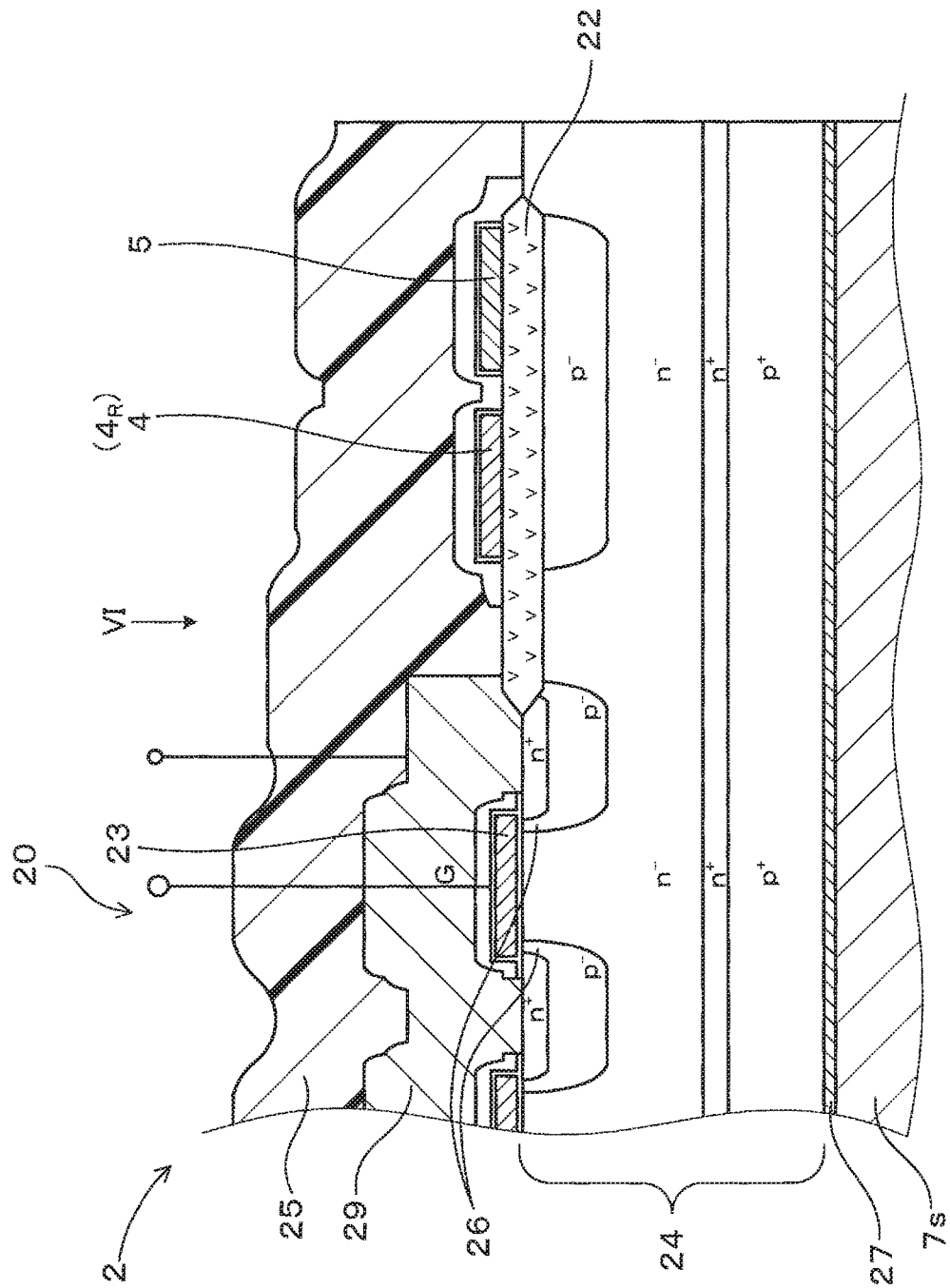
FIG. 5 is a sectional view of a semiconductor chip in the first embodiment along a line V-V of FIG. 6.
Figure 7:
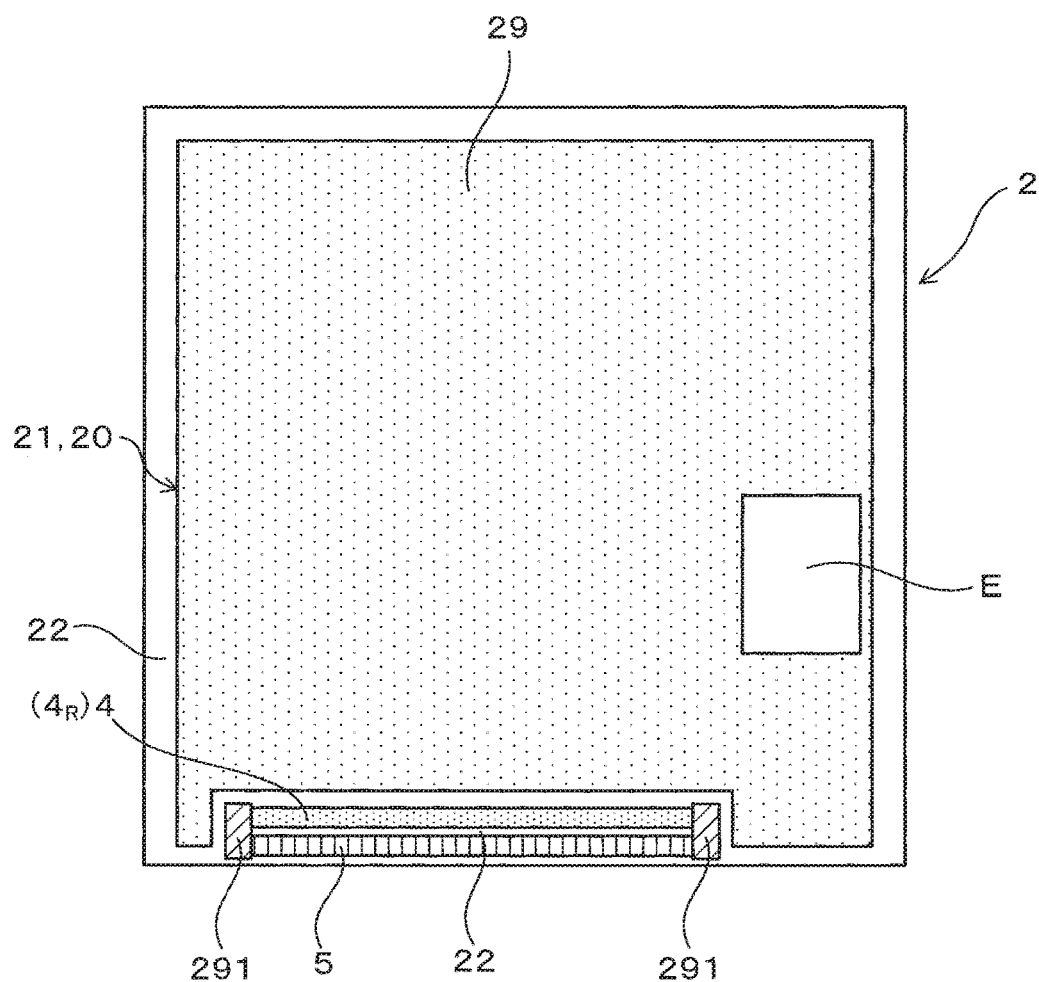
FIG. 7 is a plan view of the semiconductor chip in the first embodiment.

As illustrated in FIGS. 5 and 7, the switching element 20 and the protection element 4 (i.e., the protective resistor $4_R$) are formed in the same semiconductor chip 2.

The igniter 1 of the present embodiment is an in-vehicle igniter for igniting an ignition plug of an engine of an automobile. As illustrated in FIG. 1, the switching element 20 of the present embodiment is an IGBT 20$i$. A collector terminal C of the switching element 20 is connected to the primary winding 11 of the ignition coil 10. A secondary winding 12 of the ignition coil 10 is connected to an ignition plug 14.

A gate terminal G of the switching element 20 is connected to the control circuit section 3. Moreover, an emitter terminal E of the switching element 20 is connected to a later-described control circuit lead frame 7c. The control circuit lead frame 7c is connected to the ground.

The DC power source 13 and the control circuit section 3 are electrically connected together via a power source lead frame 7b. The control circuit section 3 of the present embodiment is a so-called monolithic IC. Among two terminals 41, 42 of the protective resistor $4_R$, the first terminal 41 is connected to the power source lead frame 7b, and the second terminal 42 is connected to a power source line 38 in the control circuit section 3. A surge protection circuit 39 is provided between the power source line 38 and the ground. The surge protection circuit 39 includes a Zener diode (not shown), a MOS transistor, etc. The surge protection circuit 39 is configured to clamp the voltage of the power source line 38 in a case where a later-described high-frequency surge such as an ESD is applied to an input terminal 71. This clamp voltage is set to a value lower than the maximum voltage applicable to the power source line 38, such as about 40 V.

When load dump occurs, surge with a voltage of about 100 V is generated. Such surge continues for a relatively long time of about several hundreds of milliseconds. Thus, the surge generated due to load dump has relatively high energy. The protective resistor $4_R$ protects the control circuit section 3 from this surge (hereinafter also referred to as "energy surge").

The high-frequency surge such as the ESD is sometimes applied to the input terminal 71 of the power source lead frame 7b. The high-frequency surge has a high voltage of several tens of kilovolts, but continues only for a short time of about an ns order. For this reason, the energy of the high-frequency surge is relatively low. However, when a voltage of several tens of kilovolts is directly applied to the protective resistor $4_R$, the protective resistor $4_R$ might be damaged. For this reason, in the present embodiment, a resistor protection Zener diode 5 is connected in parallel with the protective resistor $4_R$. The breakdown voltage of the resistor protection Zener diode 5 is set to a value lower than the dielectric strength voltage of the protective resistor $4_R$, such as about 500 V. When the high-frequency surge occurs, the resistor protection Zener diode 5 breaks down. Thus, a voltage higher than the dielectric strength voltage to the protective resistor $4_R$ is prevented from being applied. Moreover, when the resistor protection Zener diode 5 breaks down, the voltage of the power source line 38 is clamped by the surge protection circuit 39. Thus, a voltage higher than the clamp voltage of the surge protection circuit 39 to the power source line 38 is prevented from being applied.

In the present embodiment, a capacitor 16 is provided between the power source lead frame 7b and the control circuit lead frame 7c. The capacitor 16 is configured to absorb part of the high-frequency surge.

As illustrated in FIG. 1, the control circuit section 3 is connected to an IGN terminal 73. An ignition signal $S_{IGN}$ is inputted from a not-shown ECU to the control circuit section 3 via the IGN terminal 73. When the ignition signal $S_{IGN}$ is inputted, the switching element 20 is turned on and current flows in the primary winding 11. The switching element 20 is turned off when the ignition signal $S_{IGN}$ is stopped, and the current of the primary winding 11 is blocked. In this state, high voltage generated at the secondary winding 12 is utilized to ignite the ignition plug 14.

Figure 2:
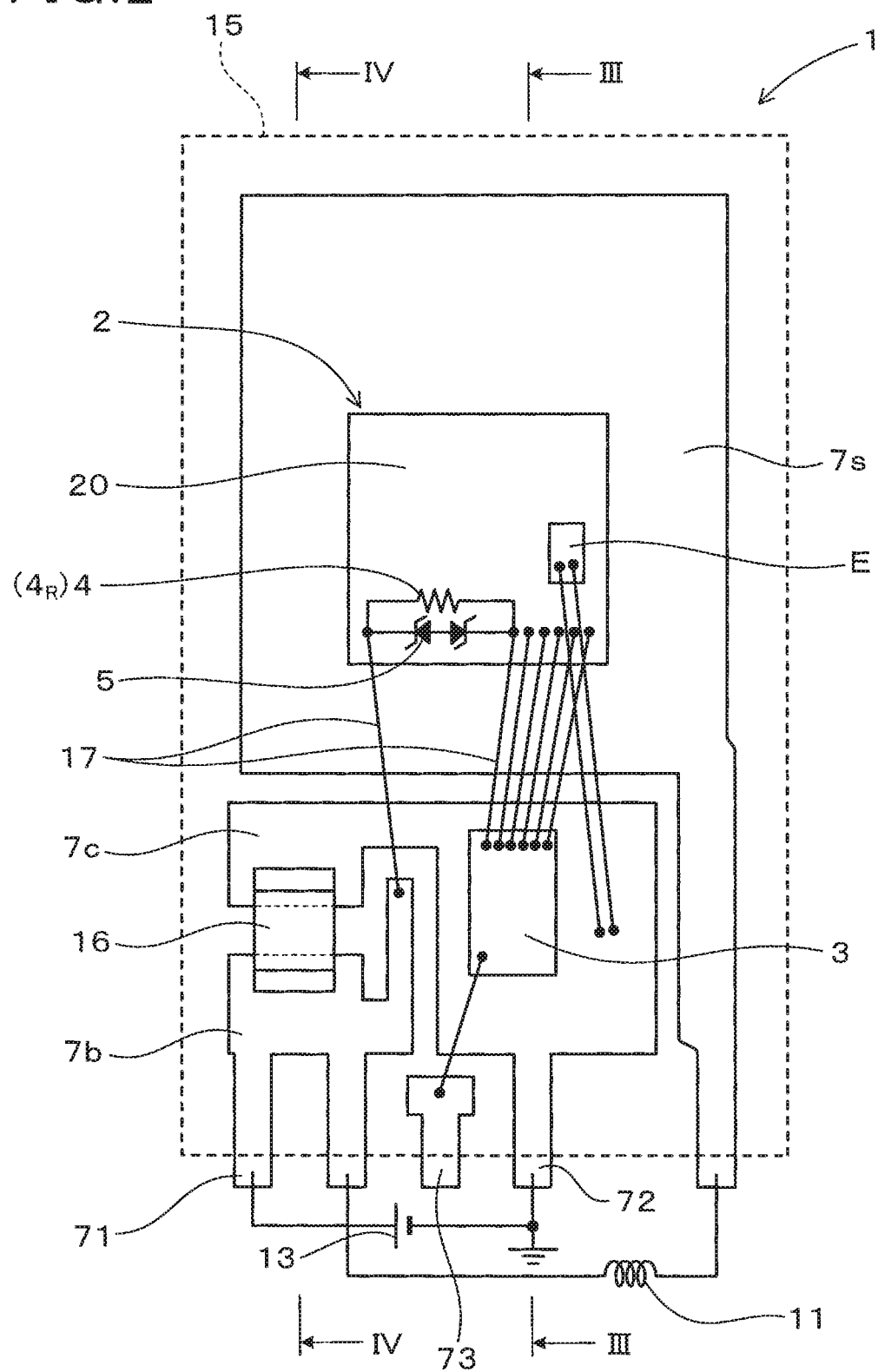
FIG. 2 is a partially-transparent plan view of the igniter in the first embodiment from an arrow II of FIG. 3.

Next, a three-dimensional structure of the igniter 1 will be described with reference to FIGS. 2 to 4. As illustrated in FIG. 2, the igniter 1 includes a semiconductor chip lead frame 7s on which the semiconductor chip 2 is mounted, the control circuit lead frame 7c on which the control circuit section 3 is mounted, the power source lead frame 7b, and the IGN terminal 73. The power source lead frame 7b is connected to a positive electrode of the DC power source 13. Moreover, the control circuit lead frame 7c is connected to the ground. The primary winding 11 of the ignition coil 10 is connected to the power source lead frame 7b and the semiconductor chip lead frame 7s. Moreover, the capacitor 16 is provided between the power source lead frame 7b and the control circuit lead frame 7c. The lead frames 7s, 7b, 7c, the semiconductor chip 2, etc. are sealed by a resin sealing member 15.

Figure 3:
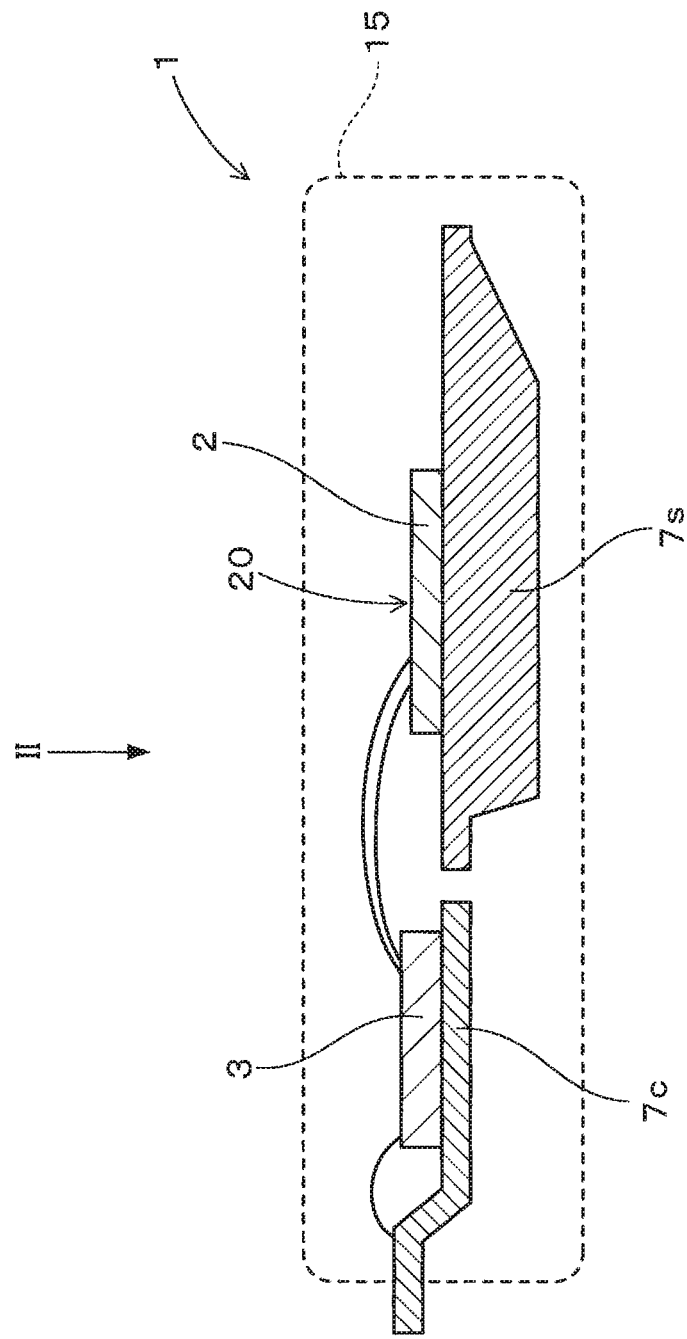
FIG. 3 is a sectional view along a line of FIG. 2.
Figure 4:
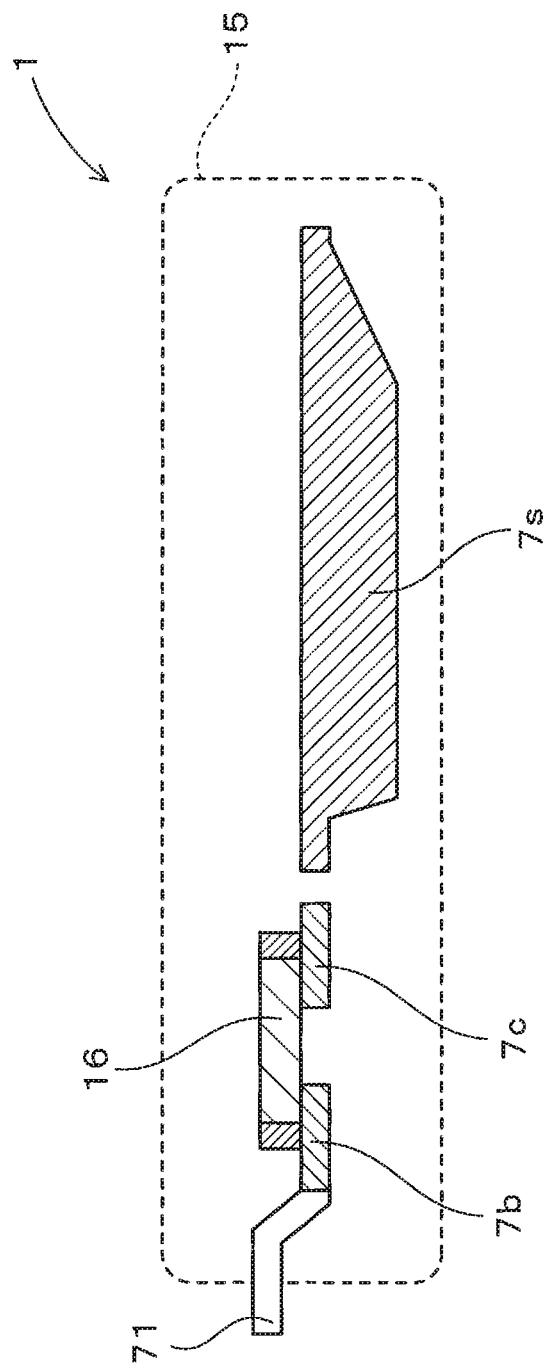
FIG. 4 is a sectional view along a line IV-IV of FIG. 2.

As illustrated in FIGS. 3 and 4, the semiconductor chip lead frame 7s is formed thicker than the control circuit lead frame 7c. With this configuration, heat generated from the semiconductor chip 2 is absorbed by the semiconductor chip lead frame 7s, leading to a higher radiation efficiency of the semiconductor chip 2. As described above, the semiconductor chip 2 is arranged in environment with high radiation efficiency, and heat can be easily released to the semiconductor chip lead frame 7s.

Next, the structure of the semiconductor chip 2 will be described. As illustrated in FIG. 5, the semiconductor chip 2 includes a silicon substrate 24, a gate electrode 23 formed on the silicon substrate 24, a wiring layer 29, and a protection film 25. Impurity diffusion layers such as a p-layer and an n-layer are formed in the silicon substrate 24. Moreover, channels 26 are formed below the gate electrode 23. When voltage is applied to the gate electrode 23, the channels 26 are inverted, and the IGBT 20$i$ is turned on.

A field oxide film 22 for element separation is formed in the semiconductor chip 2. As illustrated in FIG. 7, the field oxide film 22 is formed in a frame shape to surround an element region 21 as a region where the switching element 20 is formed. As illustrated in FIG. 5, the protective resistor $4_R$ and the resistor protection Zener diode 5 are formed on the field oxide film 22. The gate electrode 23, the protective resistor $4_R$, and the resistor protection Zener diode 5 are each made of polysilicon. That is, in the present embodiment, a film of a polysilicon layer is formed and etched in a predetermined pattern during manufacturing of the semiconductor chip 2. In this manner, the gate electrode 23, the protective resistor $4_R$, and the resistor protection Zener diode 5 are formed. A predetermined concentration of a P-type or N-type impurity is added to the gate electrode 23 and the protective resistor $4_R$.

Figure 6:
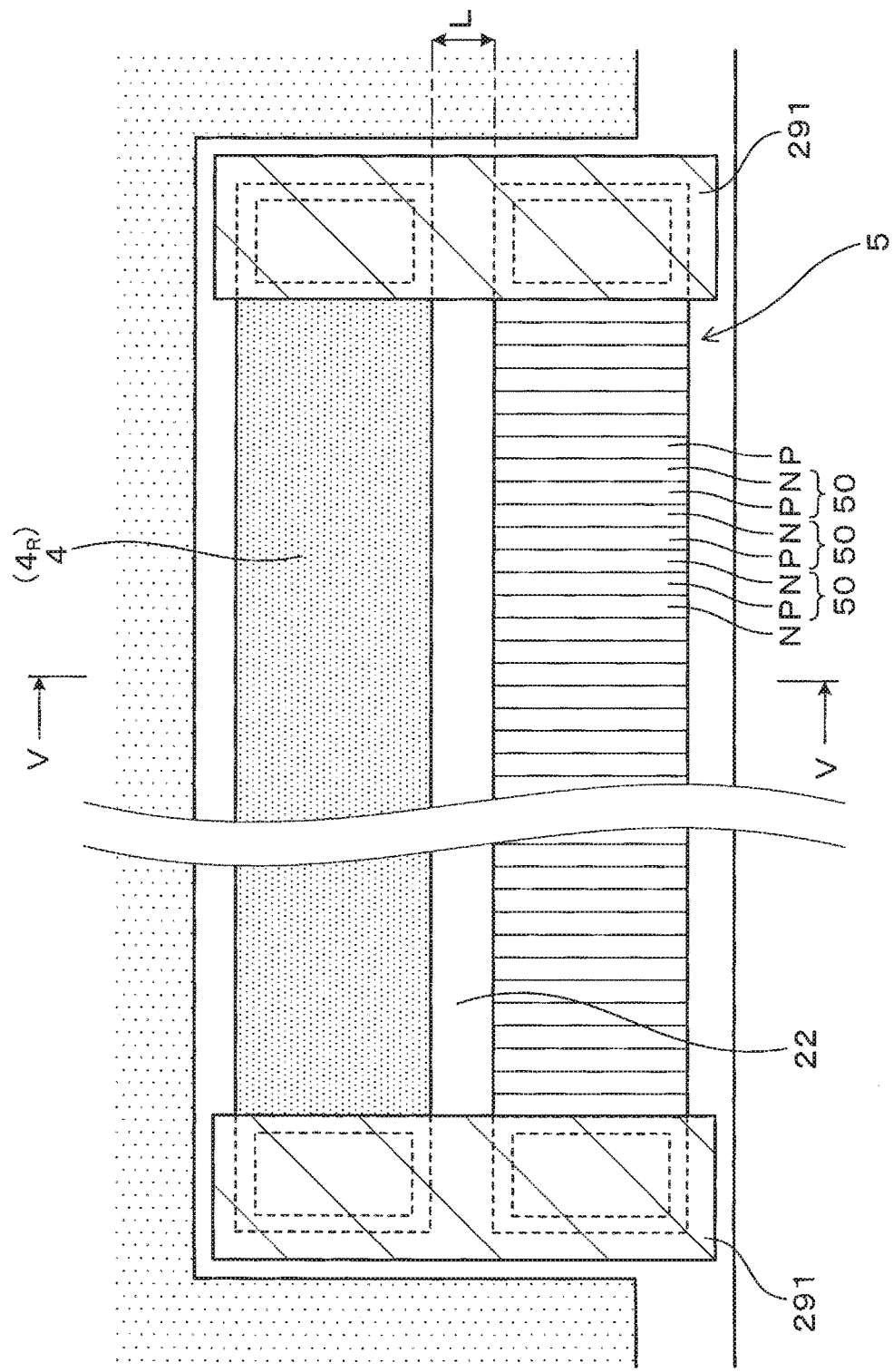
FIG. 6 is a view seen from an arrow VI of FIG. 5.

As illustrated in FIG. 6, the resistor protection Zener diode 5 is formed at a position adjacent to the protective resistor $4_R$. The protective resistor $4_R$ and the resistor protection Zener diode 5 are connected in parallel with each other via wirings 291. The wirings 291 also serve as pads for connection of wires 17 (see FIG. 2). The wirings 291 are each connected to the power source lead frame 7b and the control circuit section 3 via the wires 17.

Moreover, as illustrated in FIG. 6, a plurality of small Zener diodes 50 connected in series with each other are, in the present embodiment, formed in such a manner that a p-type impurity and an N-type impurity are alternately added to polysilicon. With the plurality of small Zener diodes 50, the breakdown voltage of the entirety of the resistor protection Zener diode 5 is adjusted to about 500 V as described above.

As illustrated in FIG. 5, a solder layer 27 is interposed between the silicon substrate 24 and the semiconductor chip lead frame 7s. Heat generated from the semiconductor chip 2 is conducted to the semiconductor chip lead frame 7s via the solder layer 27.

Next, the configuration of the control circuit section 3 will be described. As illustrated in FIG. 1, the control circuit section 3 includes, in addition to the power source line 38 and the surge protection circuit 39, an overvoltage protection circuit 31, a thermal shut-down anti-lock circuit 32, a filter circuit 33, a drive circuit 34, and an overcurrent protection circuit 35, for example. The filter circuit 33 is configured to remove noise contained in the ignition signal $S_{IGN}$. The drive circuit 34 is configured to amplify the voltage of the ignition signal $S_{IGN}$. The overvoltage protection circuit 31 is configured to protect the switching element 20 from overvoltage.

The thermal shut-down anti-lock circuit 32 is connected to a thermostatic diode 292 formed in the semiconductor chip 2. The thermal shut-down anti-lock circuit 32 is configured to forcibly turn off the switching element 20 in a case where the temperature of the semiconductor chip 2 exceeds a predetermined value. The overcurrent protection circuit 35 is connected to a sense emitter SE of the semiconductor chip 2. Part of current flowing in the switching element 20 is extracted via the sense emitter SE. The overcurrent protection circuit 35 is configured to control the switching element 20 such that the current flowing in the switching element 20 is kept at a predetermined value.

Next, operations and effects of the present embodiment will be described. As illustrated in FIGS. 1 and 5, the switching element 20 and the protection element 4 (i.e., the protective resistor $4_R$) are formed in the same semiconductor chip 2 in the present embodiment.

Thus, the protection element 4 can be downsized. That is, the amount of heat generation from the semiconductor chip 2 provided with the switching element 20 is large, and for this reason, the semiconductor chip 2 has the structure with a high radiation efficiency and is arranged in the environment with a high radiation efficiency. For example, as illustrated in FIG. 3, the semiconductor chip 2 is mounted on a thick lead frame (i.e., the semiconductor chip lead frame 7s) with high radiation efficiency. With forming the protection element 4 in the semiconductor chip 2, the radiation efficiency of the protection element 4 can be enhanced. Although the amount of heat generation from the protection element 4 is large as described above, the igniter 1 of the present embodiment is configured such that the radiation efficiency of the protection element 4 is high. Thus, a large amount of heat generation per unit area of the protection element 4 is acceptable. Consequently, the protection element 4 can be downsized.

Moreover, in the present embodiment, the switching element 20 and the protection element 4 are formed in the same semiconductor chip 2, and therefore, the number of components can be reduced. Thus, the cost for manufacturing the igniter 1 can be reduced.

Further, in the present embodiment, the protective resistor $4_R$ as the resistor arranged on the current path 8 from the DC power source 13 to the control circuit section 3 is provided as the protection element 4.

In particular, the protective resistor $4_R$ easily generates large amount of heat upon absorption of the above-described energy surge. For this reason, a great effect is provided by forming the protective resistor $4_R$ on the semiconductor chip 2 with high radiation efficiency.

In addition, as illustrated in FIG. 1, the resistor protection Zener diode 5 configured to protect the protective resistor $4_R$ is connected in parallel with the protective resistor $4_R$ in the present embodiment. The breakdown voltage of the resistor protection Zener diode 5 is set lower than the dielectric strength voltage of the protective resistor $4_R$.

With this configuration, the resistor protection Zener diode 5 breaks down in a case where the high-frequency surge such as the ESD is applied, and therefore, application of voltage higher than the dielectric strength voltage to the protective resistor $4_R$ can be reduced. Thus, the protective resistor $4_R$ can be protected from the high-frequency surge.

Moreover, the igniter 1 of the present embodiment includes the capacitor 16 connected in parallel with the DC power source 13.

Thus, part of the high-frequency surge can be absorbed by the capacitor 16. Consequently, the surge resistance of the control circuit section 3 can be further enhanced.

Figure 23:
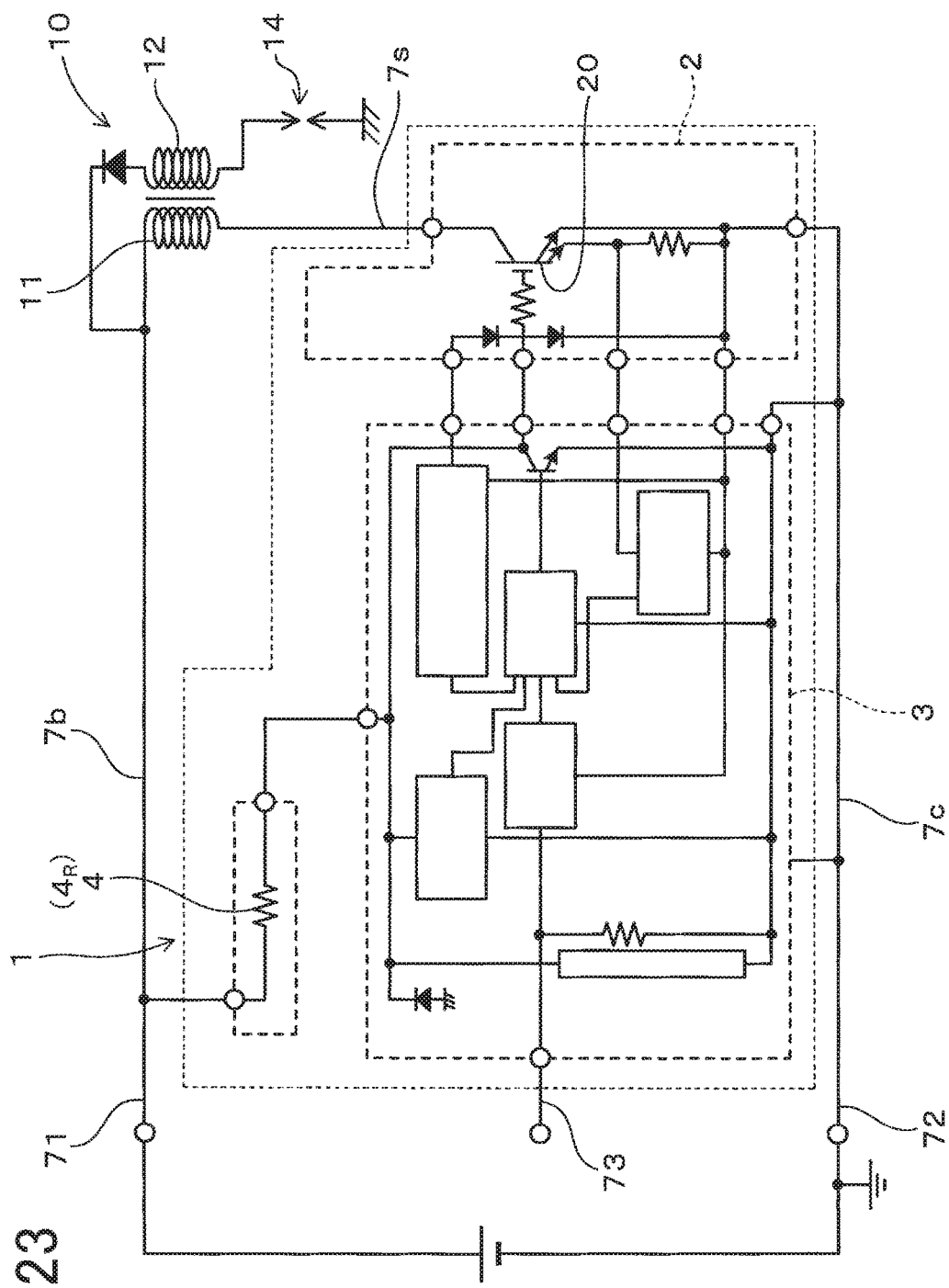
FIG. 23 is a circuit diagram of an ignition device including an igniter in a comparative form.
Figure 24:
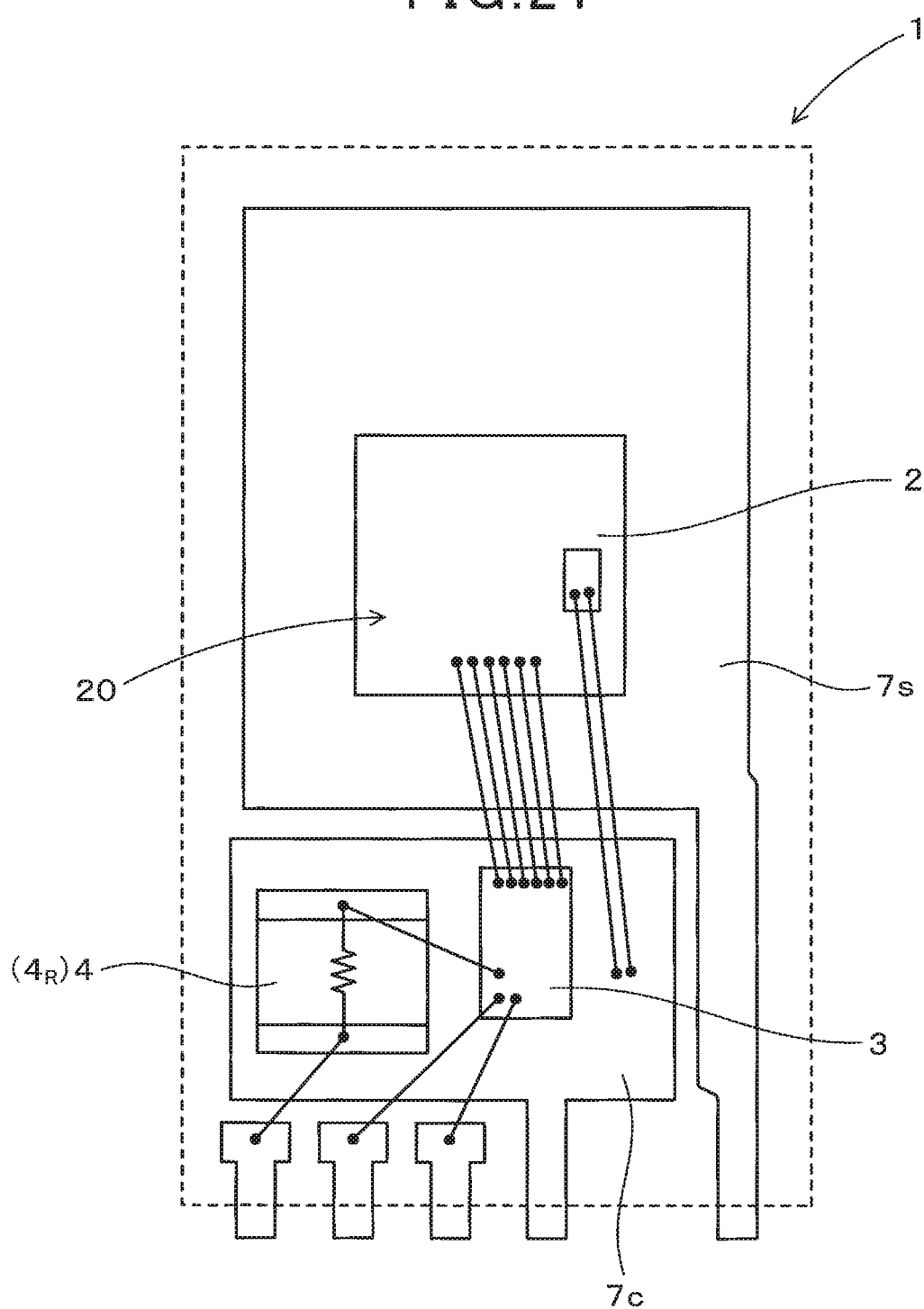
FIG. 24 is a partially cut-away plan view of the igniter in the comparative form.

As illustrated in FIGS. 23 and 24, a protection element 4 (i.e., a protective resistor $4_R$) is formed separately from a semiconductor chip 2 in a typical igniter 1. Thus, there is a problem that the size of the entirety of the igniter 1 is increased when an attempt is made to further mount other components such as a capacitor 16. On the other hand, when the protection element 4 (i.e., the protective resistor $4_R$) and the switching element 20 are formed in the same semiconductor chip 2 as in the present embodiment as illustrated in FIG. 1, the number of components can be reduced, and the capacitor 16 can be provided at an empty space. With this configuration, an increase in the size of the igniter 1 can be reduced while the surge resistance of the control circuit section 3 can be further enhanced.

Further, in the present embodiment, the protective resistor $4_R$ is formed on the field oxide film 22 as illustrated in FIG. 5. With this configuration, the field oxide film 22 formed for element separation of the IGBT 20i can be utilized for insulation of the protective resistor $4_R$. Moreover, the thickness of the field oxide film 22 is large, and therefore, the dielectric strength voltage of the protective resistor $4_R$ can be sufficiently increased.

In addition, the protective resistor $4_R$ is made of polysilicon as is the gate electrode 23. Thus, both of the gate electrode 23 and the protective resistor $4_R$ can be formed in such a manner that the polysilicon layer is formed and etched during manufacturing of the semiconductor chip 2. That is, it is not necessary to separately form a layer only for forming the protective resistor $4_R$. Thus, the cost for manufacturing the semiconductor chip 2 can be reduced.

Moreover, in the present embodiment, the resistor protection Zener diode 5 is formed at the position adjacent to the protective resistor $4_R$ as illustrated in FIG. 6. Thus, a distance L between the protective resistor $4_R$ and the resistor protection Zener diode 5 can be shortened, and inductance parasitic in the wirings 291 connecting these components can be reduced. Consequently, the protective resistor $4_R$ is easily protected from a high-frequency surge.

Further, in the present embodiment, the resistor protection Zener diode 5 is made of polysilicon as is the gate electrode 23. Thus, it is not necessary to form a layer only for forming the resistor protection Zener diode 5, and the cost for manufacturing the semiconductor chip 2 can be reduced.

In addition, the igniter 1 of the present embodiment includes, as illustrated in FIG. 3, the semiconductor chip lead frame 7s on which the switching element 20 is mounted, and the control circuit lead frame 7c on which the control circuit section 3 is mounted. The semiconductor chip lead frame 7s is formed thicker than the control circuit lead frame 7c.

Thus, the semiconductor chip lead frame 7s can be utilized as a heatsink, and the radiation efficiencies of the switching element 20 and the protective resistor $4_R$ formed in the semiconductor chip 20 can be enhanced.

As described above, according to the present embodiment, the igniter can be provided, which is configured so that the protection element can be downsized and the manufacturing cost can be reduced.

In the following embodiments, the same reference numerals as those used in the first embodiment for the drawings are used to represent components similar to those of the first embodiment unless otherwise noted.

(Second Embodiment)

Figure 8:
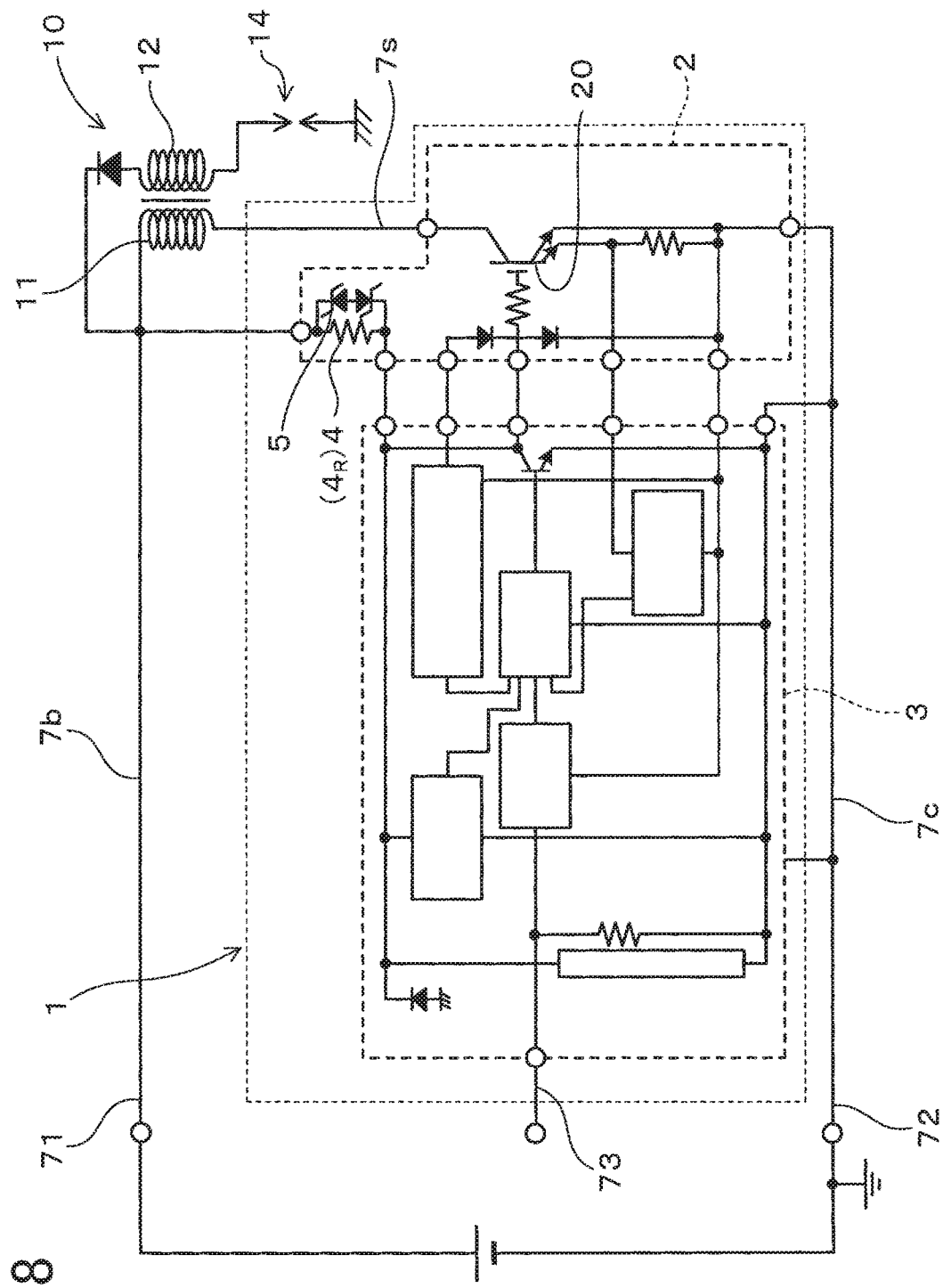
FIG. 8 is a circuit diagram of an ignition device including an igniter in a second embodiment.

The present embodiment is an example where no capacitor 16 is provided as illustrated in FIG. 8. In the present embodiment, a protective resistor $4_R$ is protected from the high-frequency surge only by a resistor protection Zener diode 5 when high-frequency surge such as an ESD is applied.

According to the above-described configuration, no capacitor 16 is provided. Thus, the number of components can be reduced, and an igniter 1 can be downsized.

Other configurations, features, and advantageous effects similar to those of the first embodiment are provided.

(Third Embodiment)

Figure 9:
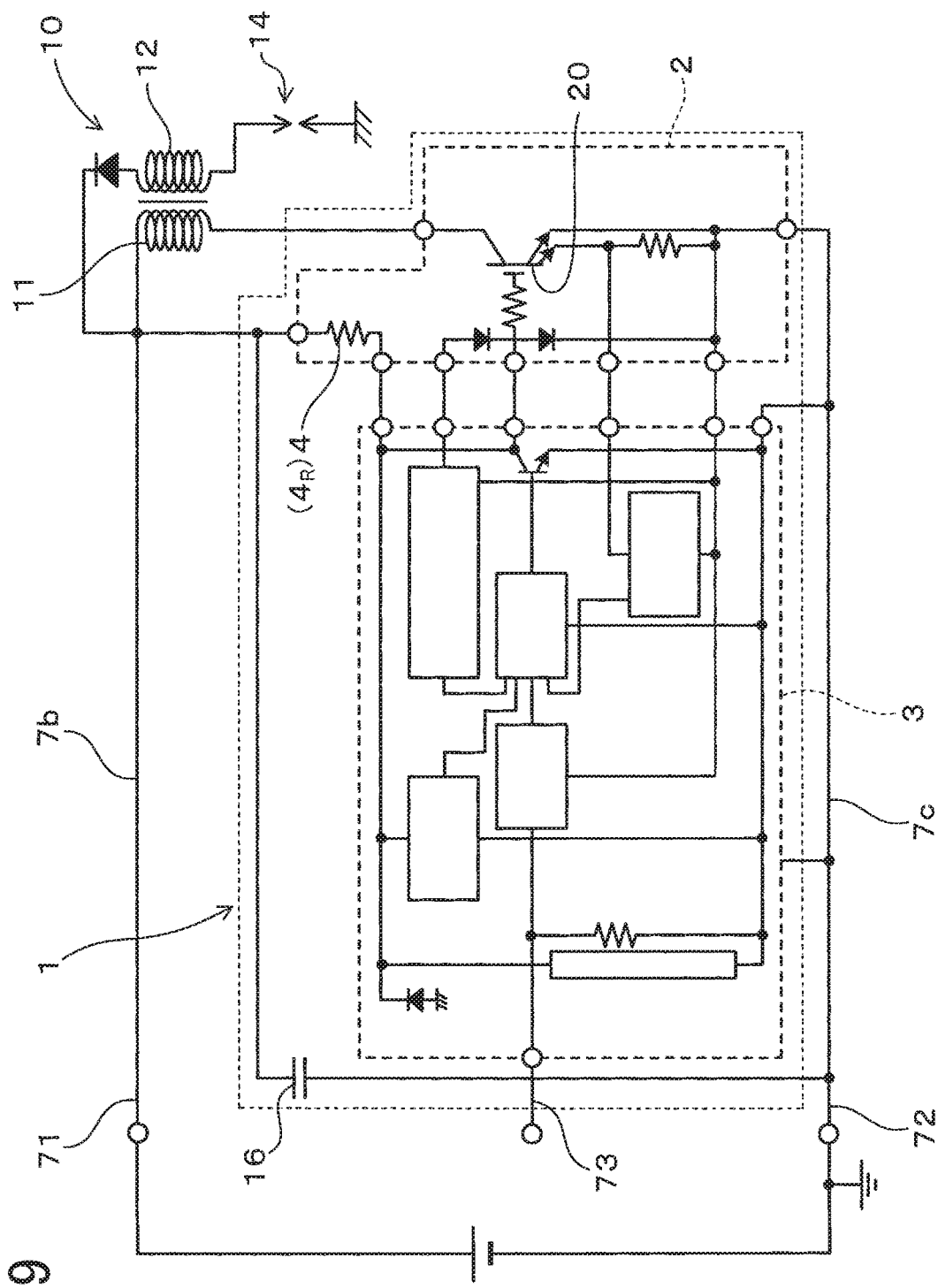
FIG. 9 is a circuit diagram of an ignition device including an igniter in a third embodiment.

The present embodiment is an example where no resistor protection Zener diode 5 is provided as illustrated in FIG. 9. In the present embodiment, a protective resistor $4_R$ is protected from the high-frequency surge only by a capacitor 16 when a high-frequency surge occurs.

Other configurations, features, and advantageous effects similar to those of the first embodiment are provided.

(Fourth Embodiment)

Figure 10:
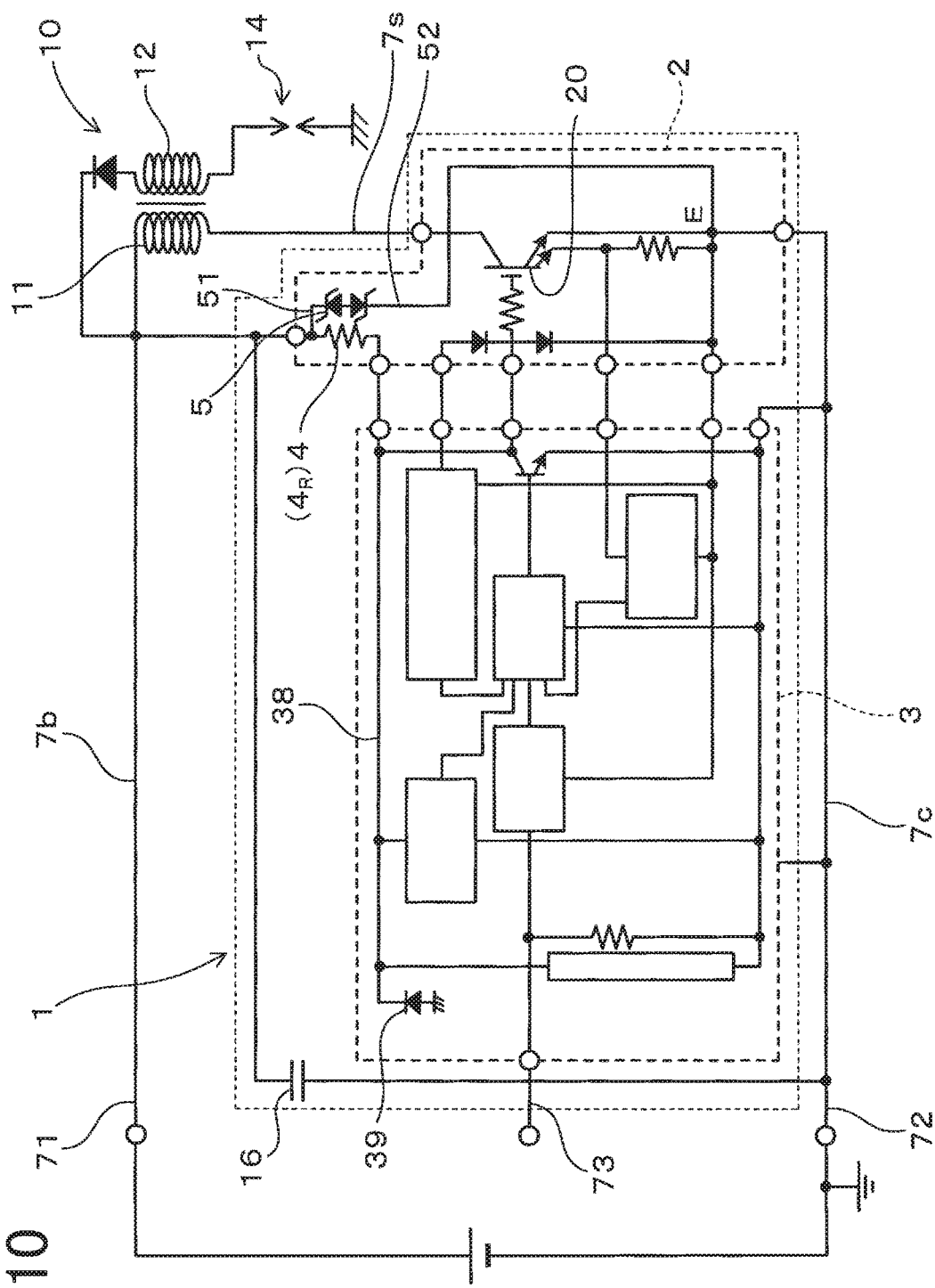
FIG. 10 is a circuit diagram of an ignition device including an igniter in a fourth embodiment.

The present embodiment is an example where a circuit configuration of a semiconductor chip 2 is changed as illustrated in FIG. 10. In the present embodiment, a high-potential terminal 51 of a resistor protection Zener diode 5 is connected to a protective resistor $4_R$, and a low-potential terminal 52 of the resistor protection Zener diode 5 is connected to an emitter terminal E of a switching element 20. The resistor protection Zener diode 5 breaks down when high-frequency surge occurs. Thereafter, the high-frequency surge flows to the ground via the emitter terminal E and a control circuit lead frame 7c.

Other configurations, features, and advantageous effects similar to those of the first embodiment are provided.

(Fifth Embodiment)

Figure 11:
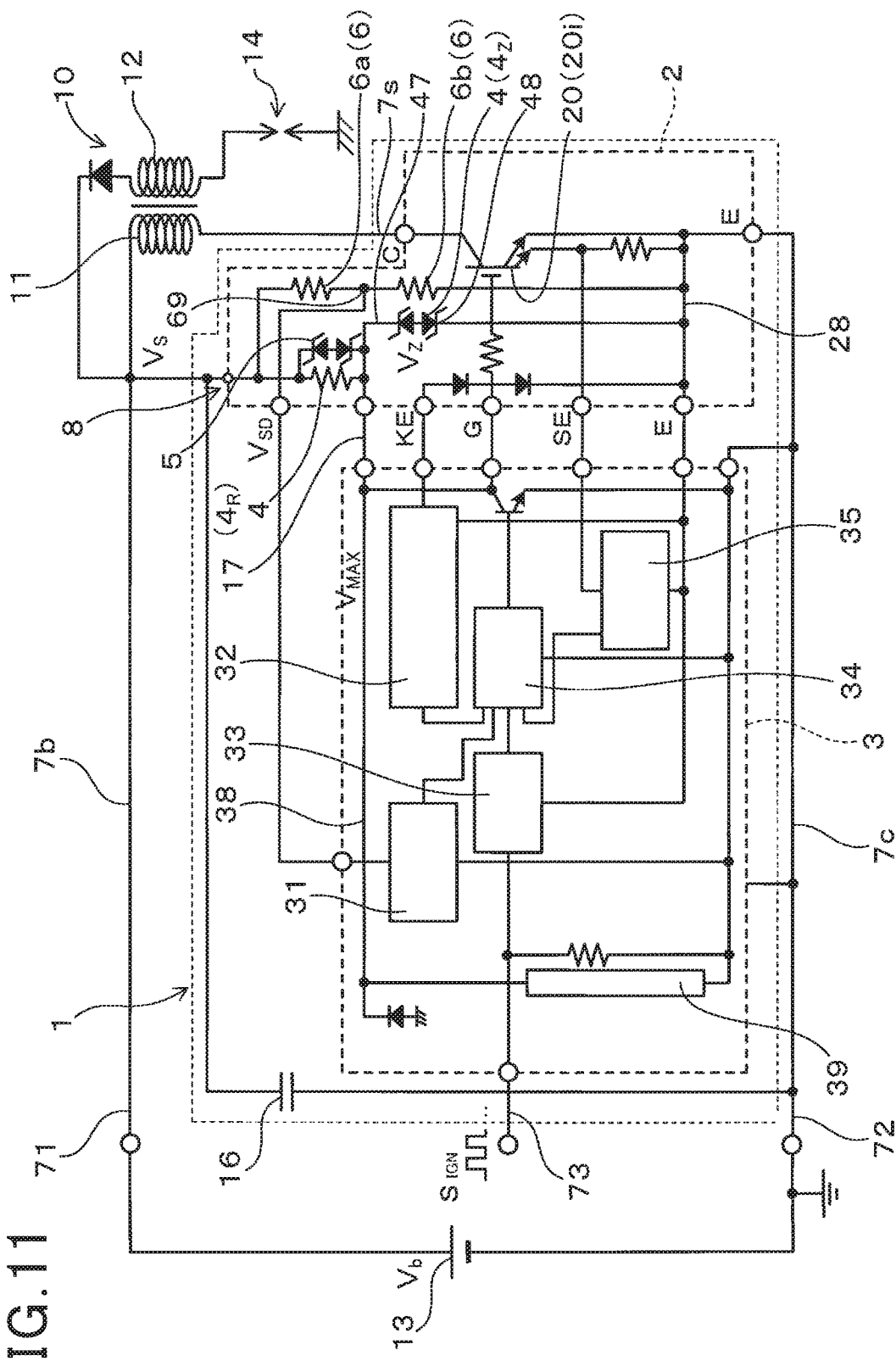
FIG. 11 is a circuit diagram of an ignition device including an igniter in a fifth embodiment.

The present embodiment is an example where a plurality of types of protection elements 4 are provided. As illustrated in FIG. 11, an igniter 1 of the present embodiment includes a protection Zener diode $4_Z$ as a protection element 4. The protection Zener diode $4_Z$ is connected in parallel between a power source of a control circuit section 3 and the ground. Using the protection Zener diode $4_Z$, power source voltage applied to the control circuit section 3 is kept constant. The protection Zener diode $4_Z$ is formed in a semiconductor chip 2.

In the present embodiment, a DC power source 13 having a power source voltage $V_b$ higher than the voltage (about 12 V) of a current in-vehicle battery is used. The power source voltage $V_b$ is about 50 V, for example. Moreover, the withstand voltage $V_{MAX}$ of the control circuit section 3 is lower than the power source voltage $V_b$, and is about 30 V, for example. The breakdown voltage $V_Z$ of the protection Zener diode $4_Z$ is lower than the withstand voltage $V_{MAX}$ of the control circuit section 3. That is, a relationship among the voltages satisfies:

$$V_b > V_{MAX} > V_Z.$$

If the power source voltage $V_b$ were directly applied to the control circuit section 3, the control circuit section 3 might be damaged. For this reason, the protection Zener diode $4_Z$ is used to decrease the voltage applied to the control circuit section 3 to the breakdown voltage $V_Z$ in the present embodiment.

Figure 12:
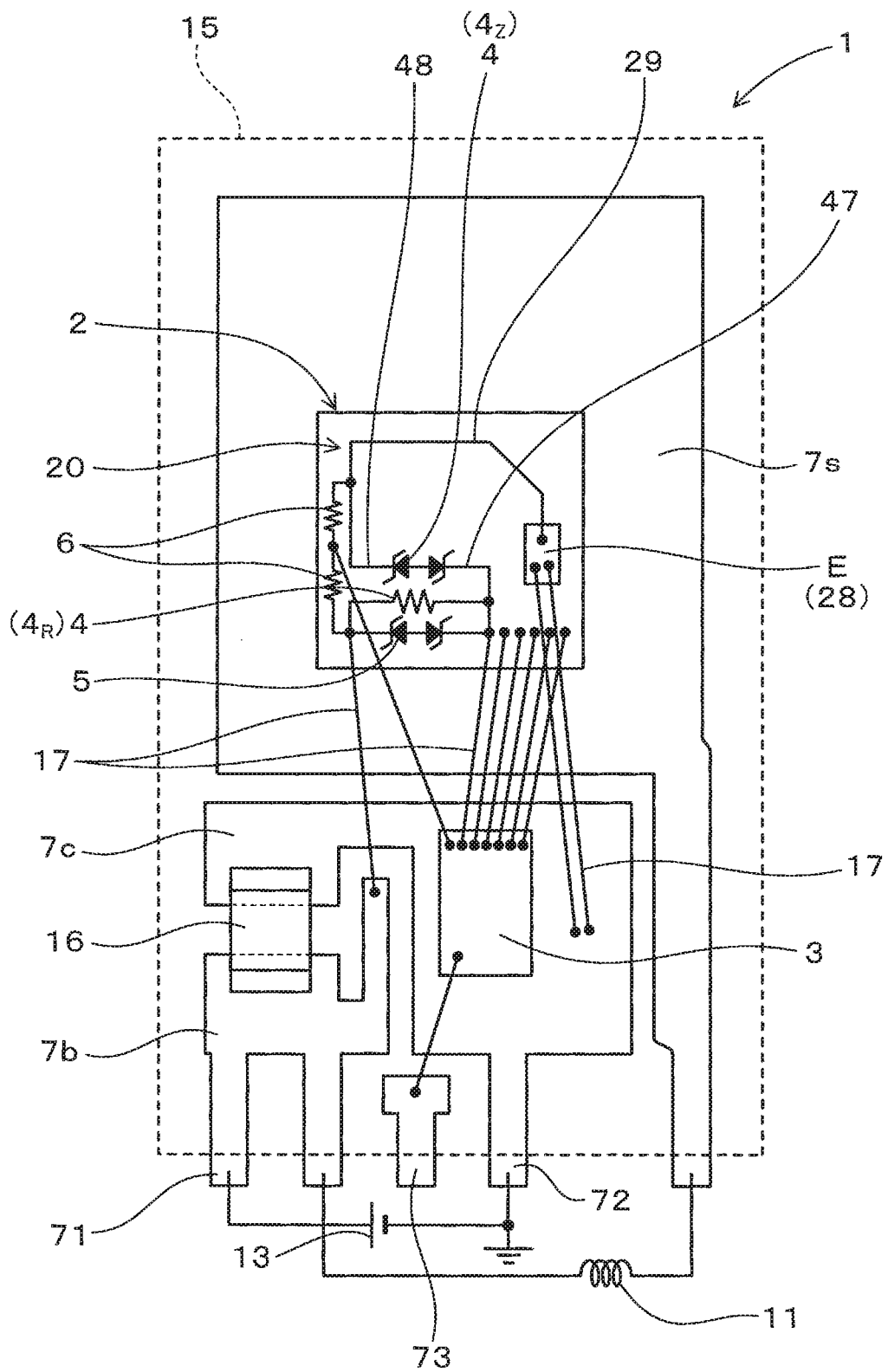
FIG. 12 is a partially-transparent plan view of the igniter in the fifth embodiment.

As illustrated in FIGS. 11 and 12, the semiconductor chip 2 includes an in-chip ground section 28 (i.e., an emitter terminal E) connected to the ground. A low-potential terminal 48 of the protection Zener diode $4_Z$ is electrically connected to the in-chip ground section 28. Moreover, a high-potential terminal 47 of the protection Zener diode $4_Z$ is connected to a power source line 38 of the control circuit section 3 via a wire 17.

Figure 13:
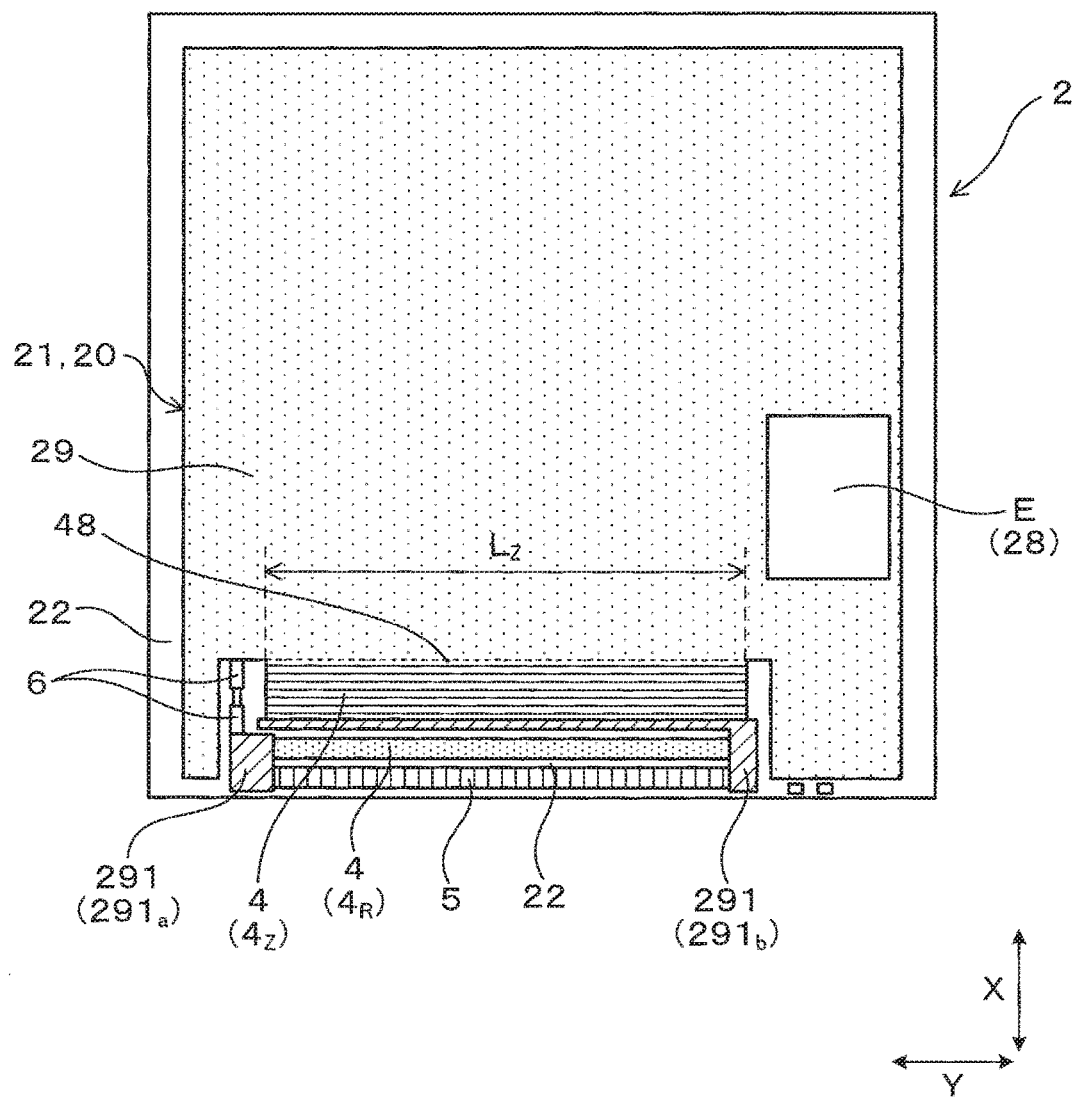
FIG. 13 is a plan view of a semiconductor chip in the fifth embodiment.
Figure 15:
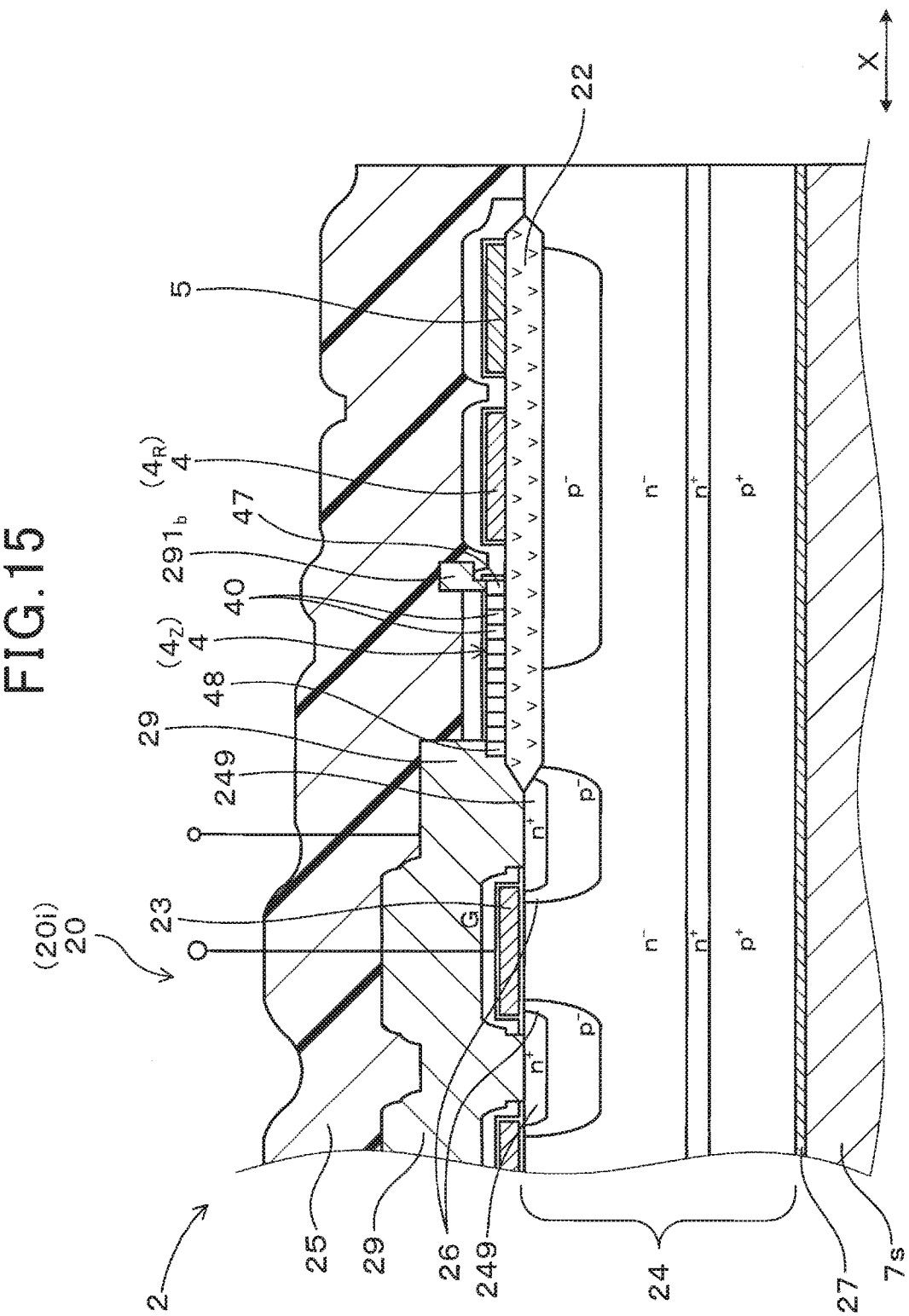
FIG. 15 is a sectional view along a line XV-XV of FIG. 14.

As illustrated in FIGS. 13 and 15, the semiconductor chip 2 of the present embodiment includes an element separation field oxide film 22 as in the first embodiment. The protection Zener diode $4_Z$ is formed on the field oxide film 22. Moreover, in the present embodiment, a protective resistor $4_R$ and a resistor protection Zener diode 5 are formed on the field oxide film 22 as in the first embodiment.

As illustrated in FIG. 15, a switching element 20 of the present embodiment is an IGBT 20i. A gate electrode 23 of the IGBT 20i is made of polysilicon. Moreover, the protective resistor $4_R$, the protection Zener diode $4_Z$, and the resistor protection Zener diode 5 are also made of polysilicon as is the gate electrode 23.

Figure 14:
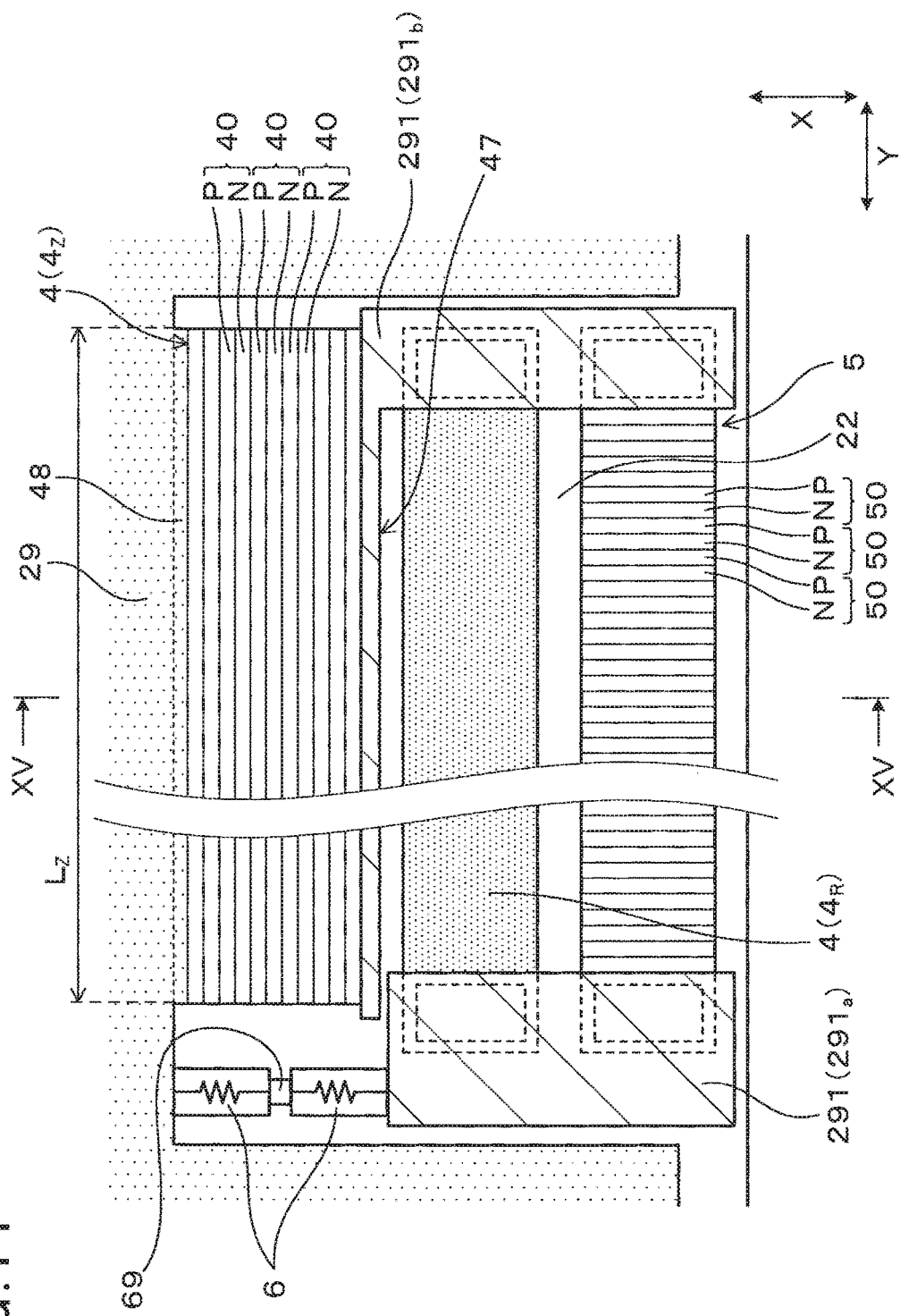
FIG. 14 is an enlarged view of a principal part of FIG. 13.

As illustrated in FIGS. 13 and 14, the resistor protection Zener diode 5 and the protective resistor $4_R$ are connected in parallel with each other via wirings 291. The wirings 291 also serve as pads for connection of the wires 17 (see FIG. 12). Among the two wirings $291_a$, $291_b$, the first wiring $291_a$ is connected to a power source lead frame 7b (see FIG. 12) via the wire 17. Moreover, the second wiring $291_b$ is connected to the control circuit section 3 via the wire 17.

As illustrated in FIG. 14, the resistor protection Zener diode 5 includes a plurality of small Zener diodes 50 connected in series with each other as in the first embodiment. The resistor protection Zener diode 5 is formed in such a manner that an N-type impurity and a P-type impurity are alternately added to polysilicon. Moreover, the protection Zener diode $4_Z$ also includes a plurality of small Zener diodes 40 connected in series with each other.

As illustrated in FIGS. 13 and 14, the protection Zener diode $4_Z$ is configured such that current flows in a direction (hereinafter also referred to as an "X-direction") perpendicular to longitudinal directions (hereinafter also referred to as a "Y-direction") of the protective resistor $4_R$ and the resistor protection Zener diode 5. That is, the small Zener diodes 40 of the protection Zener diode $4_Z$ are stacked in the X-direction perpendicular to the Y-direction. Moreover, the length $L_Z$ of the protection Zener diode $4_Z$ in the Y-direction is substantially equal to the Y-direction length of each of the protective resistor $4_R$ and the resistor protection Zener diode 5. That is, in the present embodiment, the transverse width $L_Z$ of the protection Zener diode $4_Z$ is formed long. With this configuration, the electric resistance of the protection Zener diode $4_Z$ is reduced.

As illustrated in FIGS. 14 and 15, the high-potential terminal 47 of the protection Zener diode $4_Z$ is connected to the wiring $291_b$. The protection Zener diode $4_Z$ is electrically connected to the protective resistor $4_R$, the resistor protection Zener diode 5, and the control circuit section 3 via the wiring $291_b$. Moreover, the low-potential terminal 48 of the protection Zener diode $4_Z$ is connected to a wiring layer 29 of the IGBT 20$i$. The wiring layer 29 is connected to an emitter diffusion layer 249 of the IGBT 20$i$. Moreover, the wiring layer 29 is connected to the in-chip ground section 28 (i.e., the emitter terminal E) as illustrated in FIGS. 12 and 13. The in-chip ground section 28 is connected to the ground via the wire 17 and a control circuit lead frame 7$c$. As described above, in the present embodiment, the low-potential terminal 48 of the protection Zener diode $4_Z$ is connected to the ground via the wiring layer 29, the in-chip ground section 28, the wire 17, and the control circuit lead frame 7$c$.

Meanwhile, the control circuit section 3 of the present embodiment includes, as illustrated in FIG. 11, an overvoltage protection circuit 31 as in the first embodiment. The overvoltage protection circuit 31 is configured to forcibly turn off the switching element 20 in a case where voltage Vs applied from the DC power source 13 to the semiconductor chip 2 increases for any reason. For example, in a case where load dump occurs, a surge of about 100 V is caused, and accordingly, the applied voltage Vs increases. In this state, when the switching element 20 is on, there is a probability that large current flows in the switching element 20 and the switching element 20 is damaged due to heat generation. Thus, in this case, the switching element 20 is forcibly turned off by the overvoltage protection circuit 31.

As described above, in the present embodiment, the protection Zener diode $4_Z$ is used to keep the voltage applied to the control circuit section 3 at a constant value. Thus, even when the surge is caused and the applied voltage $V_S$ increases, the voltage of the power source line 38 of the control circuit section 3 is kept constant. Thus, even when the voltage of the power source line 38 is measured by means of the overvoltage protection circuit 31, it cannot be detected whether or not the applied voltage $V_S$ has increased. For this reason, in the present embodiment, voltage detection resistors 6 configured to detect the applied voltage $V_S$ are provided.

More specifically, in the present embodiment, two voltage detection resistors 6 (6$a$, 6$b$) are provided. The overvoltage protection circuit 31 is connected to a connection point 69 between these two voltage detection resistors 6$a$, 6$b$. That is, the applied voltage $V_S$ is divided by the two voltage detection resistors 6$a$, 6$b$, and such a voltage division value $V_{SD}$ is measured by the overvoltage protection circuit 31. The overvoltage protection circuit 31 forcibly turns off the switching element 20 in a case where the voltage division value $V_{SD}$ becomes higher than a preset upper limit. Thus, the switching element 20 is protected.

As illustrated in FIGS. 11 to 14, the voltage detection resistors 6 are formed in the semiconductor chip 2 in the present embodiment. The voltage detection resistors 6 can be made of polysilicon, for example. Moreover, the voltage detection resistors 6 can be formed together with the protection Zener diode $4_Z$ etc. on the field oxide film 22.

Functions and effects of the present embodiment will be described. As illustrated in FIG. 11, the igniter 1 of the present embodiment includes, as the protection element 4, the protection Zener diode $4_Z$ configured to keep the voltage applied to the control circuit section 3 at a constant value. Moreover, the protection Zener diode $4_Z$ is formed in the semiconductor chip 2.

The protection Zener diode $4_Z$ easily generates large amount of heat when breakdown current flows. Moreover, the semiconductor chip 2 is arranged in environment with high radiation efficiency as described above. For example, the semiconductor chip 2 is arranged on the thick semiconductor chip lead frame 7$s$. Thus, when the protection Zener diode $4_Z$ is formed on the semiconductor chip 2, the lead frame 7$s$ for radiation of the semiconductor chip can be also utilized for radiation of the protection Zener diode $4_Z$, and the radiation efficiency of the protection Zener diode $4_Z$ can be increased. Consequently, an increase in the amount of heat generation per unit area of the protection Zener diode $4_Z$ is acceptable. As a result, the protection Zener diode $4_Z$ can be downsized, and the igniter 1 can be downsized.

Moreover, as illustrated in FIG. 15, the protection Zener diode $4_Z$ of the present embodiment is formed on the field oxide film 22.

Thus, the dielectric strength voltage of the protection Zener diode $4_Z$ can be sufficiently ensured.

Further, in the present embodiment, the gate electrode 23 and the protection Zener diode $4_Z$ of the switching element 20 are made of polysilicon.

Thus, both of the gate electrode 23 and the protection Zener diode $4_Z$ can be formed in such a manner that a film of a polysilicon layer is formed and etched in a predetermined pattern during manufacturing of the semiconductor chip 2. Consequently, it is not necessary to form a layer only for forming the protection Zener diode $4_Z$, and the cost for manufacturing the semiconductor chip 2 can be reduced.

In addition, the breakdown voltage $V_Z$ of the protection Zener diode $4_Z$ is lower than the withstand voltage $V_{MAX}$ of the control circuit section 3.

Thus, the control circuit section 3 can be reliably protected.

Moreover, in the present embodiment, the power source voltage $V_b$ of the DC power source 13 is decreased to the breakdown voltage $V_Z$ of the protection Zener diode $4_Z$, and the resultant is applied to the control circuit section 3. Thus, the DC power source 13 having the power source voltage $V_b$ higher than the withstand voltage $V_{MAX}$ of the control circuit section 3 can be used. During development of the igniter 1, only the power source voltage $V_b$ can be changed without a change in the control circuit section 3. Thus, the control circuit section 3 can be used for a plurality of types of igniters 1, and versatility of the control circuit section 3 can be enhanced.

Further, as illustrated in FIGS. 12 and 13, the semiconductor chip 2 of the present embodiment includes the in-chip ground section 28 connected to the ground. The low-potential terminal 48 of the protection Zener diode $4_Z$ is electrically connected to the in-chip ground section 28.

Thus, the cost for manufacturing the igniter 1 can be reduced. That is, a portion connected to the ground may be formed in the control circuit section 3 (see FIG. 21), and such a portion and the low-potential terminal 48 may be connected together via the wire 17. However, in this case, the wire 17 only for connection of the low-potential terminal 48 to the ground is necessary, and the cost for manufacturing the igniter 1 tends to increase. On the other hand, when the low-potential terminal 48 is connected to the in-chip ground section 28 as in the present embodiment, the low-potential terminal 48 can be electrically connected to the ground without using the dedicated wire 17. Thus, the cost for manufacturing the igniter 1 can be reduced.

In addition, as illustrated in FIG. 11, the control circuit section 3 of the present embodiment includes the voltage detection resistors 6 configured to detect the voltage $V_S$ applied from the DC power source 13 to the semiconductor chip 2.

Thus, even in a case where the voltage applied to the control circuit section 3 is kept constant by the protection Zener diode $4_Z$ as in the present embodiment, the applied voltage $V_S$ can be measured by the overvoltage protection circuit 31 formed in the control circuit section 3. Consequently, the switching element 20 can be forcibly turned off by the overvoltage protection circuit 31 when the applied voltage $V_S$ reaches higher than a preset value, and the switching element 20 can be protected.

Moreover, in the present embodiment, the voltage detection resistors 6 are formed in the semiconductor chip 2.

Thus, the number of components can be reduced, and the cost for manufacturing the igniter 1 can be reduced.

Other configurations, features, and advantageous effects similar to those of the first embodiment are provided.
(Sixth Embodiment)

Figure 16:
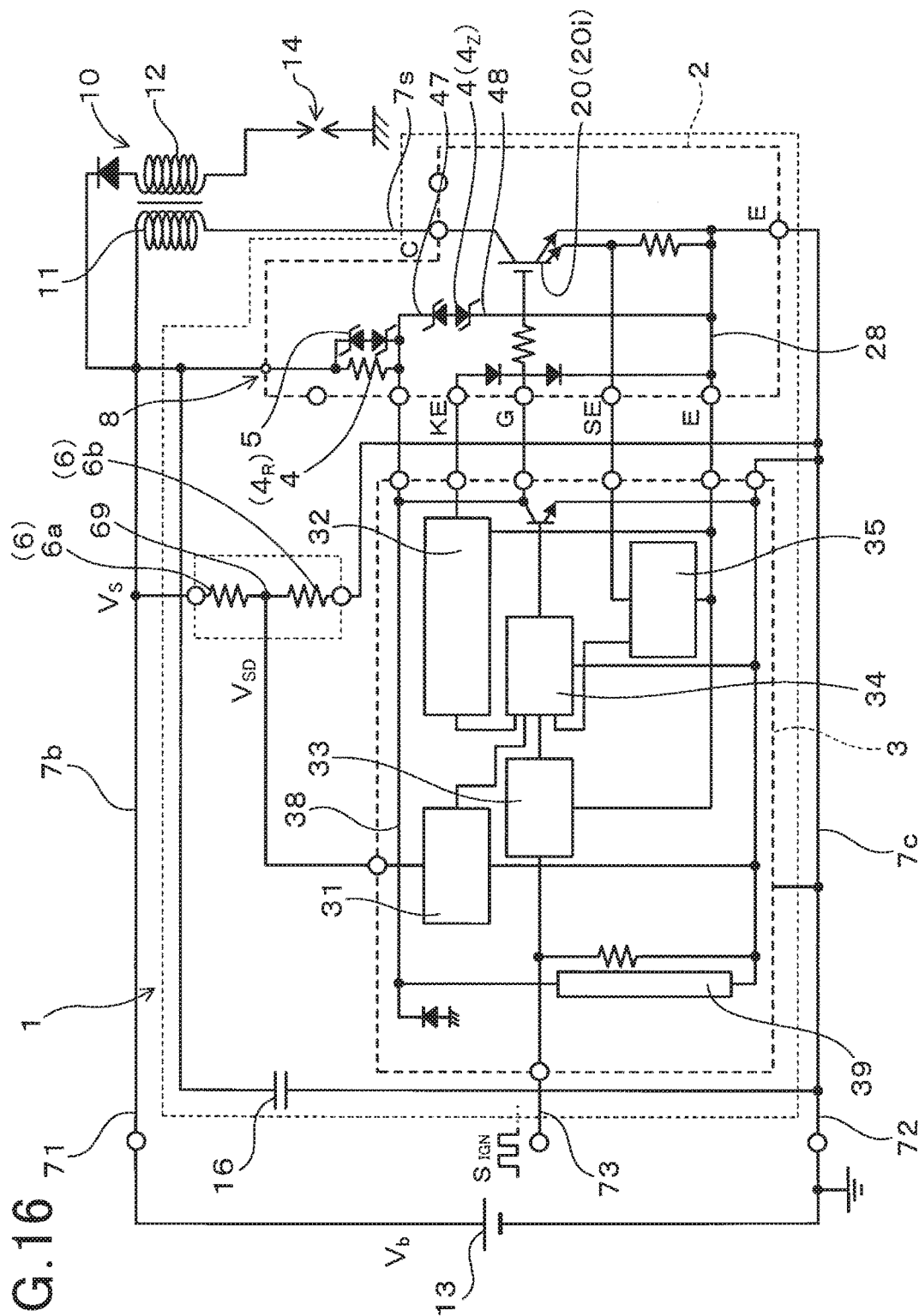
FIG. 16 is a circuit diagram of an ignition device including an igniter in a sixth embodiment.

The present embodiment is an example where arrangement positions of voltage detection resistors 6 are changed. As illustrated in FIG. 16, an igniter 1 of the present embodiment includes two voltage detection resistors 6a, 6b as in the fifth embodiment. An overvoltage protection circuit 31 is connected to a connection point 69 between these two voltage detection resistors 6a, 6b. The overvoltage protection circuit 31 is configured to measure the voltage division value $V_{SD}$ of the applied voltage $V_S$ obtained by the voltage detection resistors 6a, 6b. It is configured such that a switching element 20 is forcibly turned off when the voltage division value $V_SD$ reaches higher than a preset value. Moreover, in the present embodiment, the voltage detection resistors 6a, 6b are formed separately from a semiconductor chip 2.

Functions and effects of the present embodiment will be described. As described above, in the present embodiment, the voltage detection resistors 6a, 6b are formed separately from the semiconductor chip 2. Thus, the configuration of the semiconductor chip 2 can be simplified. Consequently, the area of the semiconductor chip 2 can be decreased, and the cost for manufacturing the semiconductor chip 2 can be reduced.

Other configurations, features, and advantageous effects similar to those of the fifth embodiment are provided.
(Seventh Embodiment)

Figure 17:
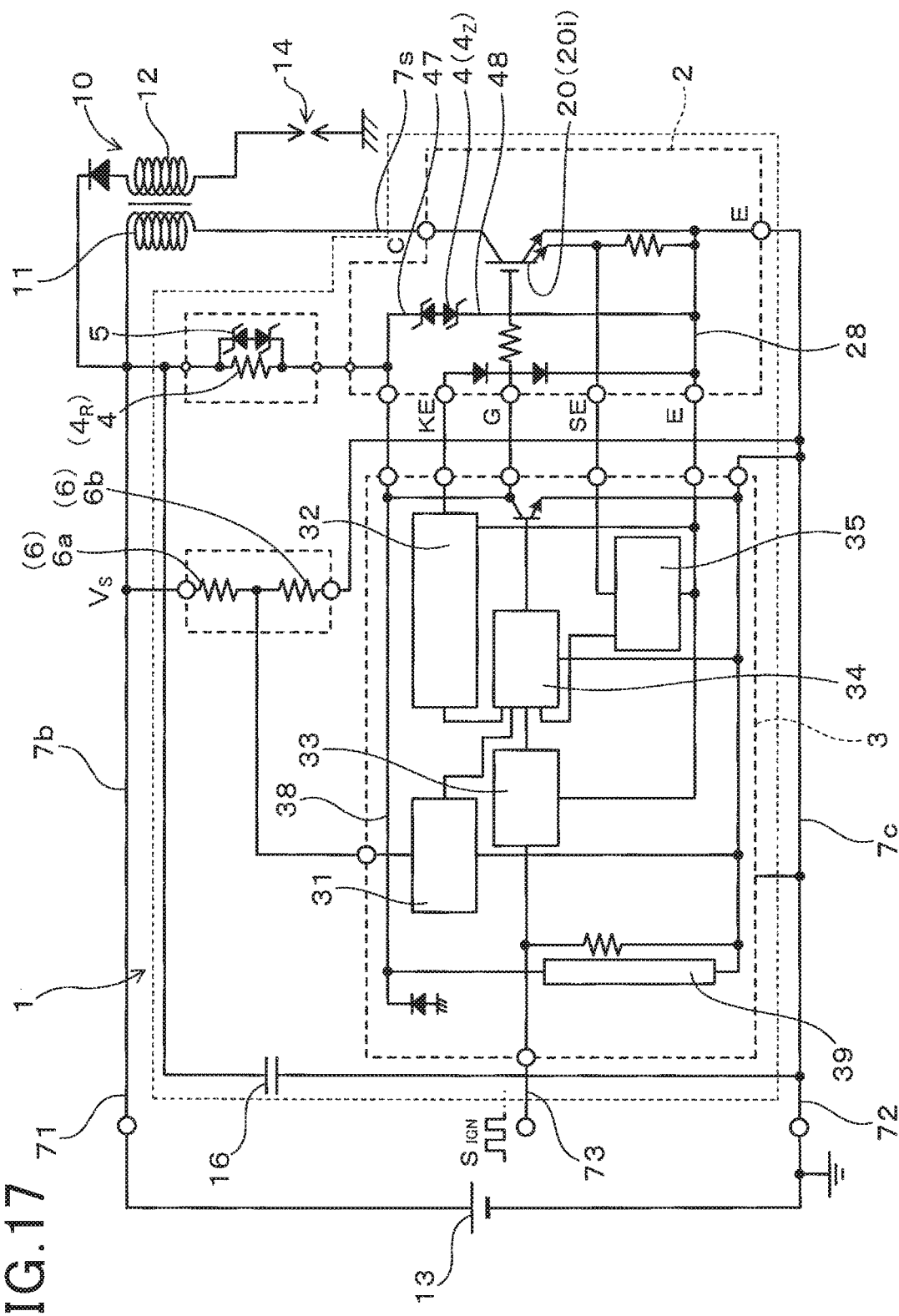
FIG. 17 is a circuit diagram of an ignition device including an igniter in a seventh embodiment.

The present embodiment is an example where only some of the plurality of protection elements 4 ($4_R$, $4_Z$) are formed in a semiconductor chip 2. As illustrated in FIG. 17, an igniter 1 of the present embodiment includes two protection elements 4 which are a protective resistor $4_R$ and a protection Zener diode $4_Z$. Among the two protection elements 4 ($4_R$, $4_Z$), the protective resistor $4_R$ as a first protection element 4 is formed separately from the semiconductor chip 2. Moreover, the protection Zener diode $4_Z$ as a second protection element 4 is formed in the semiconductor chip 2.

Other configurations, features, and advantageous effects similar to those of the fifth embodiment are provided.

Note that in the present embodiment, only the protection Zener diode $4_Z$ of the two protection elements 4 ($4_R$, $4_Z$) is formed in the semiconductor chip 2, but the present invention is not limited to such a configuration. That is, the protection Zener diode $4_Z$ may be formed separately from the semiconductor chip 2, and the protective resistor $4_R$ may be formed in the semiconductor chip 2.
(Eighth Embodiment)

Figure 18:
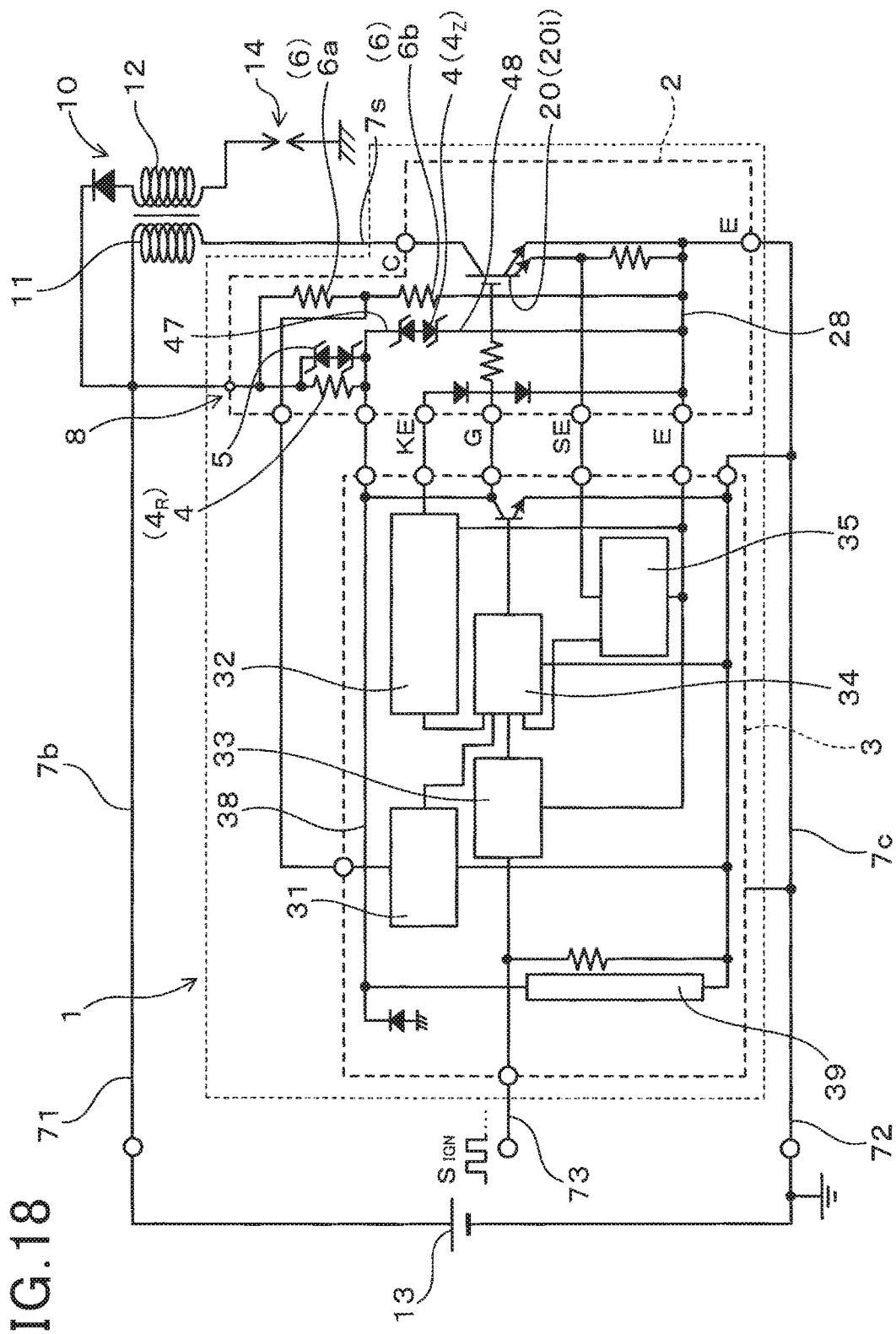
FIG. 18 is a circuit diagram of an ignition device including an igniter in an eighth embodiment.

The present embodiment is an example where no capacitor 16 is provided as illustrated in FIG. 18. In the present embodiment, a protective resistor $4_R$, a resistor protection Zener diode 5, and a protection Zener diode $4_Z$ are formed in a semiconductor chip 2. In the present embodiment, a protective resistor $4_R$ is protected from the high-frequency surge only by a resistor protection Zener diode 5 when a high-frequency surge such as ESD is applied.

According to the above-described configuration, no capacitor 16 is provided. Thus, the number of components can be reduced, and an igniter 1 can be downsized.

Other configurations, features, and advantageous effects similar to those of the fifth embodiment are provided.
(Ninth Embodiment)

Figure 19:
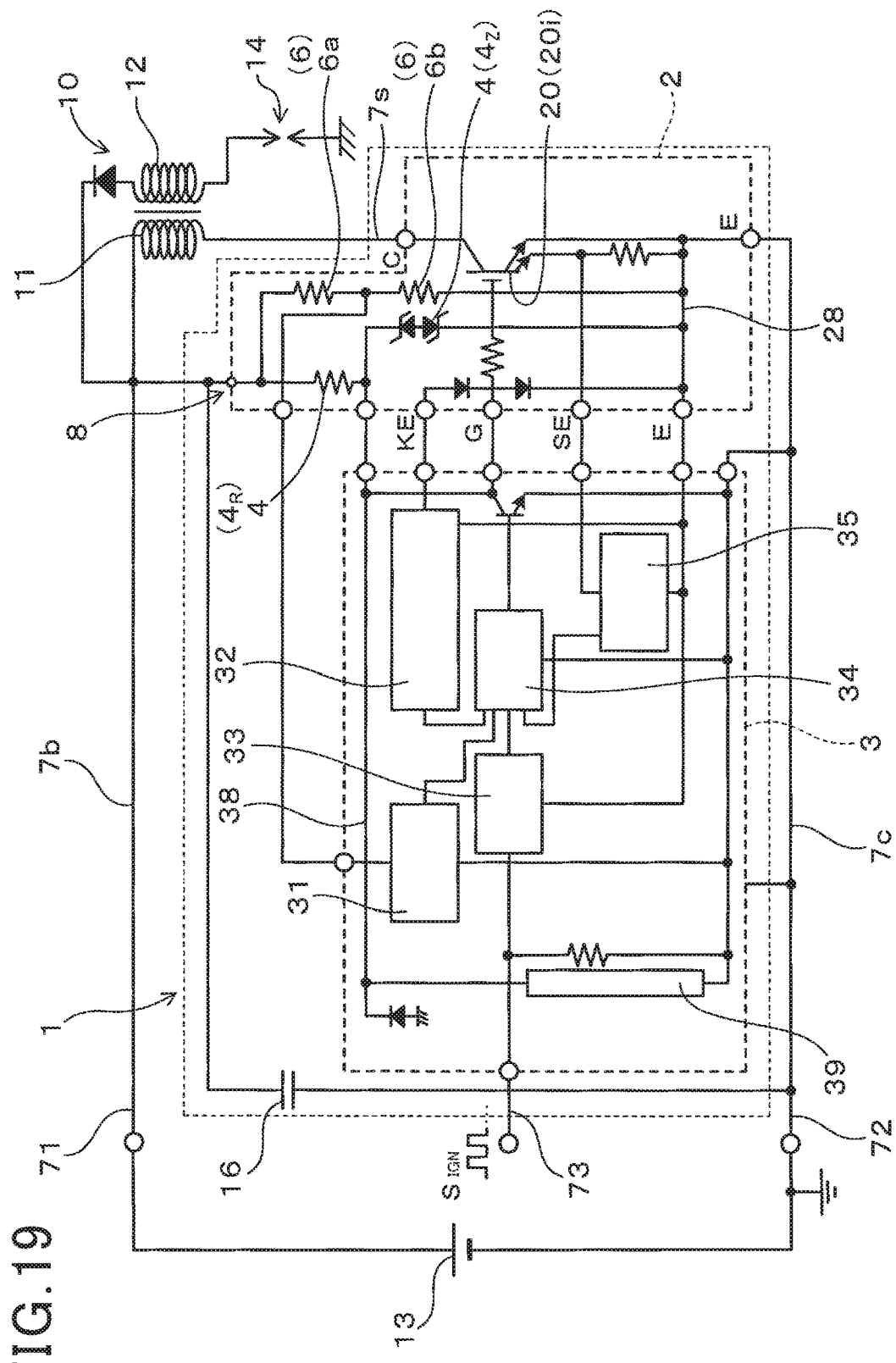
FIG. 19 is a circuit diagram of an ignition device including an igniter in a ninth embodiment.

The present embodiment is an example where no resistor protection Zener diode 5 is provided as illustrated in FIG. 19. A protective resistor $4_R$ and a protection Zener diode $4_Z$ are formed in a semiconductor chip 2. In the present embodiment, a protective resistor $4_R$ is protected from the high-frequency surge only by a capacitor 16 when high-frequency surge occurs.

Other configurations, features, and advantageous effects similar to those of the first embodiment are provided.
(Tenth Embodiment)

Figure 20:
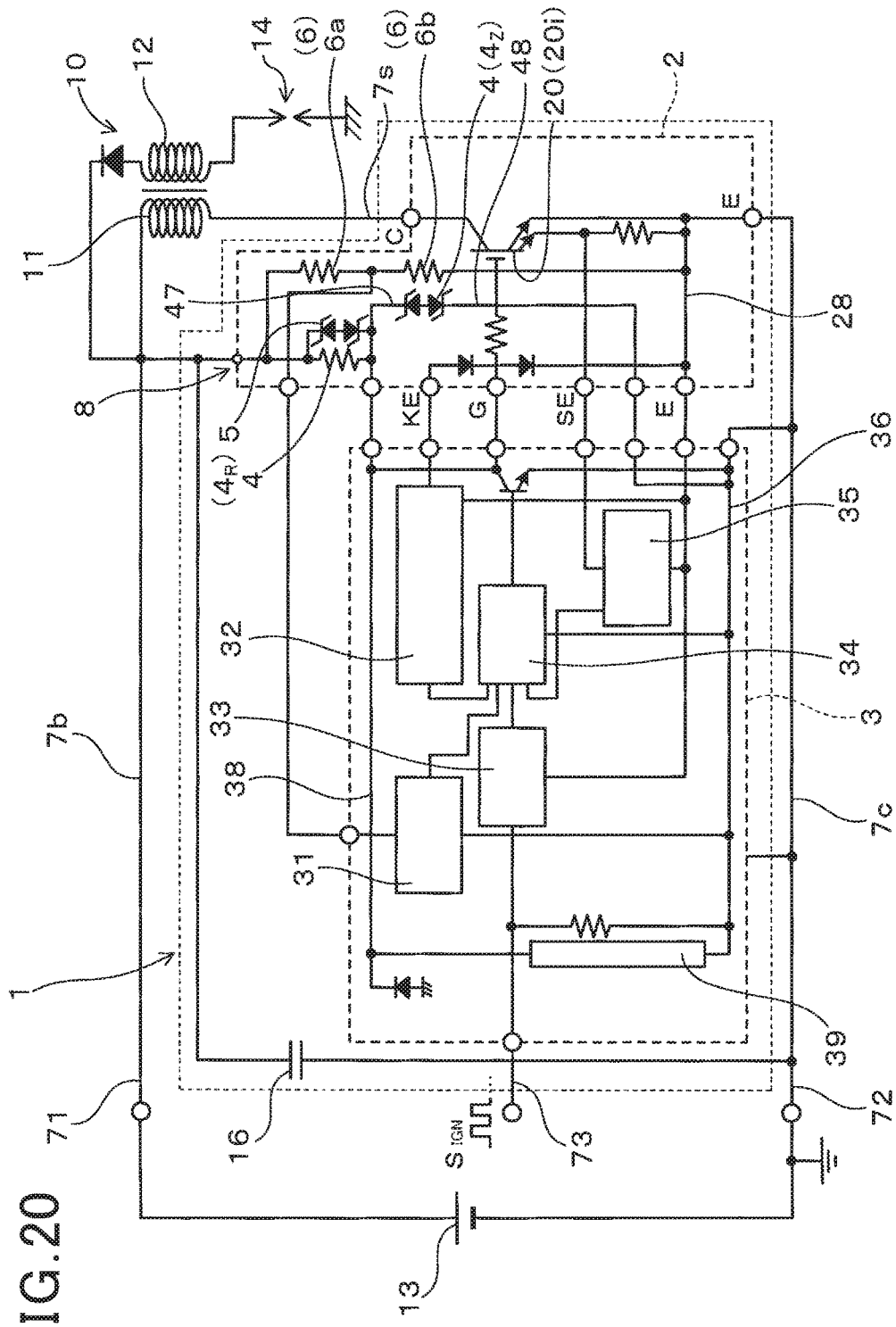
FIG. 20 is a circuit diagram of an ignition device including an igniter in a tenth embodiment.
Figure 21:
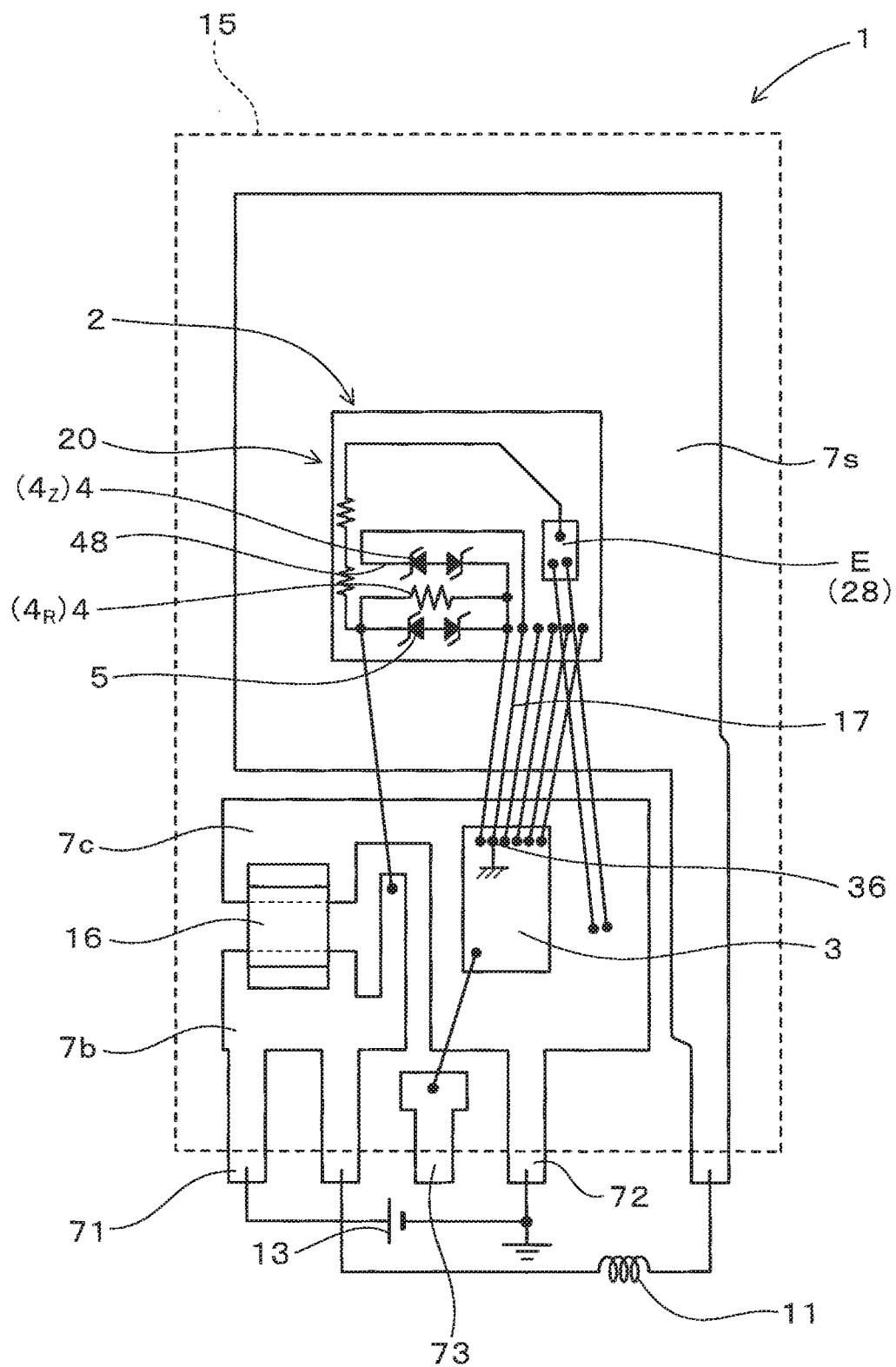
FIG. 21 is a partially cut-away plan view of the igniter in the tenth embodiment.

The present embodiment is an example where the method for connecting a protection Zener diode $4_Z$ and the ground is changed. As illustrated in FIGS. 20 and 21, a control circuit section 3 of the present embodiment includes an in-control-circuit ground section 36 connected to the ground. A low-potential terminal 48 of the protection Zener diode $4_Z$ is connected to the in-control-circuit ground section 36. As illustrated in FIG. 21, the low-potential terminal 48 is connected to the in-control-circuit ground section 36 via a wire 17.

Functions and effects of the present embodiment will be described. As illustrated in FIG. 21, the configuration of the present embodiment is employed so that the protection Zener diode $4_Z$ can be directly connected to the control circuit section 3. Thus, a current path from the protection Zener diode $4_Z$ to the control circuit section 3 can be shortened, and resistance and inductance parasitic in this current path can be reduced. Consequently, voltage applied to the control circuit section 3 is easily held at an accurate value by the protection Zener diode $4_Z$.

Other configurations, features, and advantageous effects similar to those of the first embodiment are provided.
(Eleventh Embodiment)

Figure 22:
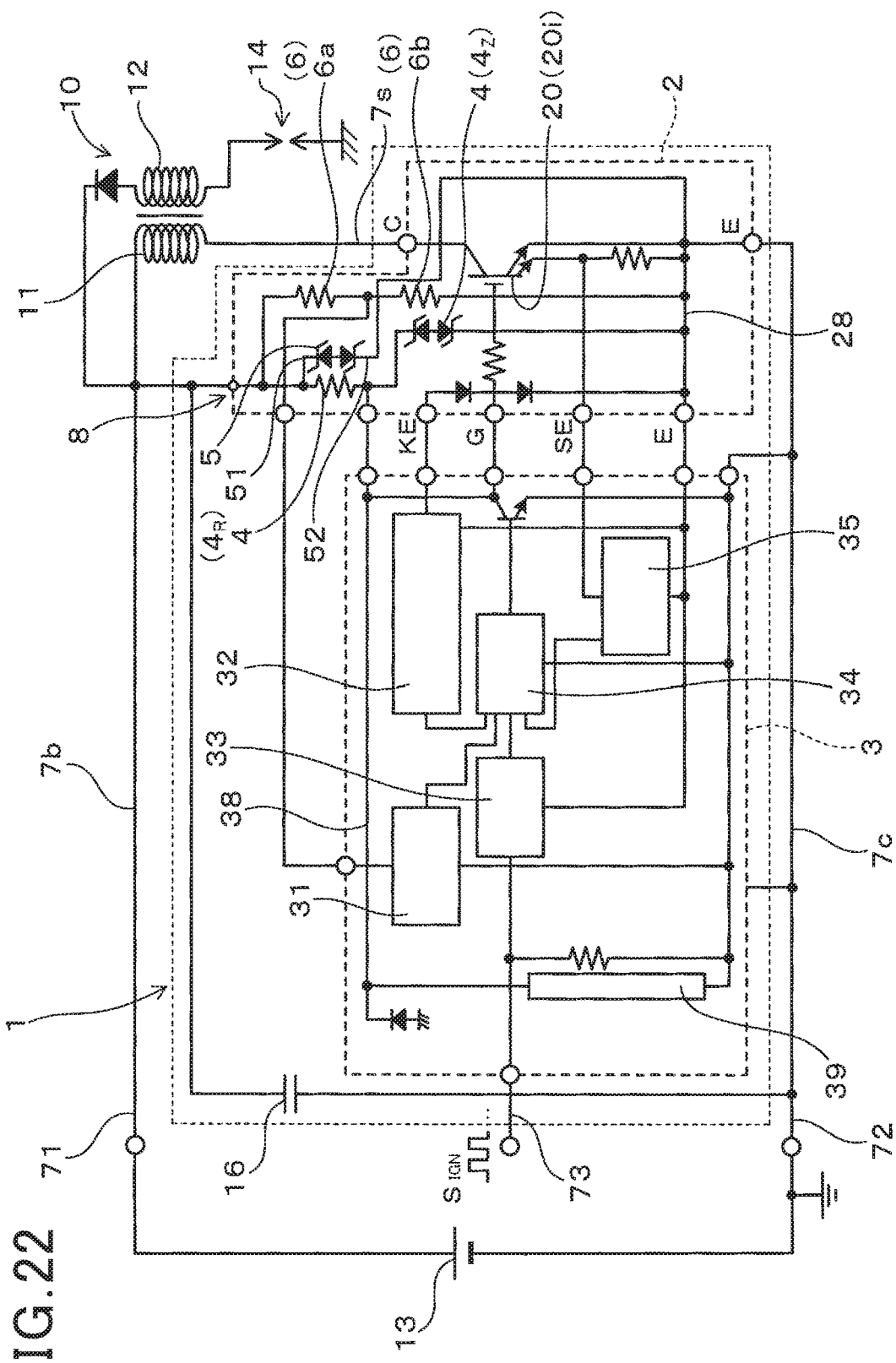
FIG. 22 is a circuit diagram of an ignition device including an igniter in an eleventh embodiment.

The present embodiment is an example where a circuit configuration of a semiconductor chip 2 is changed as illustrated in FIG. 22. In the present embodiment, a protective resistor $4_R$, a resistor protection Zener diode 5, and a protection Zener diode $4_Z$ are formed in the semiconductor chip 2 as in the fifth embodiment. Moreover, a high-potential terminal 51 of the resistor protection Zener diode 5 is connected to the protective resistor $4_R$, and a low-potential terminal 52 of the resistor protection Zener diode 5 is connected to an emitter terminal E (i.e., an in-chip ground section 28) of a switching element 20. The resistor protection Zener diode 5 breaks down when high-frequency surge occurs. Thereafter, the high-frequency surge flows to the ground via the emitter terminal E and a control circuit lead frame 7c. With this configuration, the protective resistor $4_R$ is protected from the high-frequency surge.

Other configurations, features, and advantageous effects similar to those of the fifth embodiment are provided.

The present disclosure has been described with reference to the embodiments, but it is understood that the present disclosure is not limited to these embodiments and structures. The present disclosure also includes variations and modifications within an equivalent range. In addition, not only various combinations and forms but also other combinations and forms including more, less, or a single element are also within the scope and sprit of the present disclosure.

The invention claimed is:

1. An igniter comprising:
a switching element connected to a primary winding of an ignition coil,
a control circuit section configured to control operation of the switching element, and
a protection element electrically connected to the control circuit section to electrically protect the control circuit section,
wherein the switching element and the protection element are formed in the same semiconductor chip,
the igniter further includes, as the protection element, a protective resistor as a resistor arranged on a current path from a DC power source to the control circuit section,
a resistor protection Zener diode having a breakdown voltage lower than a dielectric strength voltage of the protective resistor is connected in parallel with the protective resistor, and
the resistor protection Zener diode is formed together with the switching element and the protective resistor in the semiconductor chip.

2. An igniter comprising:
a switching element connected to a primary winding of an ignition coil,
a control circuit section configured to control operation of the switching element, and
a protection element electrically connected to the control circuit section to electrically protect the control circuit section,
wherein the switching element and the protection element are formed in the same semiconductor chip,
the igniter further includes, as the protection element, a protective resistor as a resistor arranged on a current path from a DC power source to the control circuit section,
the switching element is an IGBT,
the semiconductor chip includes a field oxide film for element separation,
a gate electrode of the IGBT and the protective resistor are made of polysilicon,
the protective resistor is formed on the field oxide film
the resistor protection Zener diode having the breakdown voltage lower than the dielectric strength voltage of the protective resistor is connected in parallel with the protective resistor, and
the resistor protection Zener diode is made of polysilicon, and is formed at a position adjacent to the protective resistor on the field oxide film.

3. An igniter comprising:
a switching element connected to a primary winding of an ignition coil,
a control circuit section configured to control operation of the switching element, and
a protection element electrically connected to the control circuit section to electrically protect the control circuit section,
wherein the switching element and the protection element are formed in the same semiconductor chip,
the igniter further includes, as the protection element, a protective resistor as a resistor arranged on a current path from a DC power source to the control circuit section,
the igniter further includes a semiconductor chip lead frame on which the semiconductor chip is mounted, and
a control circuit lead frame on which the control circuit section is mounted,
wherein the semiconductor chip lead frame is formed thicker than the control circuit lead frame.

4. An igniter comprising:
a switching element connected to a primary winding of an ignition coil,
a control circuit section configured to control operation of the switching element, and
a protection element electrically connected to the control circuit section to electrically protect the control circuit section,
wherein the switching element and the protection element are formed in the same semiconductor chip,
the igniter further includes a protection Zener diode configured to keep voltage applied to the control circuit section at a constant value as the protection element,
the igniter further includes a voltage detection resistor configured to detect voltage applied from the DC power source to the semiconductor chip, and
an overvoltage protection circuit configured to forcibly turn off the switching element in a case where the applied voltage reaches higher than a preset value.

5. The igniter according to claim 4,
wherein the igniter further includes, as the protection element, a protective resistor as a resistor arranged on a current path from a DC power source to the control circuit section.

6. The igniter according to claim 1,
wherein the igniter further includes a capacitor connected in parallel with the DC power source.

7. The igniter according to claim 1,
wherein the switching element is an IGBT,
the semiconductor chip includes a field oxide film for element separation,
a gate electrode of the IGBT and the protective resistor are made of polysilicon, and
the protective resistor is formed on the field oxide film.

8. The igniter according to claim 4,
wherein the switching element is the IGBT,
the semiconductor chip includes a field oxide film for element separation,
the gate electrode of the IGBT and the protection Zener diode are made of polysilicon, and
the protection Zener diode is formed on the field oxide film.

9. The igniter according to claim 4,
wherein the semiconductor chip includes an in-chip ground section connected to a ground, and
a low-potential terminal of the protection Zener diode is electrically connected to the in-chip ground section.

10. The igniter according to claim 4,
wherein the control circuit section includes an in-control-circuit ground section connected to a ground, and
a low-potential terminal of the protection Zener diode is electrically connected to the in-control-circuit ground section.

11. The igniter according to claim 4,
wherein the voltage detection resistor is formed in the semiconductor chip.

12. The igniter according to claim 4,
wherein the voltage detection resistor is provided separately from the semiconductor chip.

* * * * *